US011513783B2

(12) United States Patent
Urawaki et al.

(10) Patent No.: US 11,513,783 B2
(45) Date of Patent: Nov. 29, 2022

(54) CONTROL APPARATUS, PROGRAM UPDATE SYSTEM, AND PROGRAM UPDATE METHOD

(71) Applicant: HITACHI AUTOMOTIVE SYSTEMS, LTD., Hitachinaka (JP)

(72) Inventors: Koji Urawaki, Tokyo (JP); Hidetoshi Teraoka, Tokyo (JP); Fumiharu Nakahara, Hitachinaka (JP); Kenichi Kurosawa, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 499 days.

(21) Appl. No.: 16/603,618

(22) PCT Filed: Mar. 19, 2018

(86) PCT No.: PCT/JP2018/010857
§ 371 (c)(1),
(2) Date: Oct. 8, 2019

(87) PCT Pub. No.: WO2018/190080
PCT Pub. Date: Oct. 18, 2018

(65) Prior Publication Data
US 2021/0089294 A1 Mar. 25, 2021

(30) Foreign Application Priority Data

Apr. 13, 2017 (JP) .............................. JP2017-079821

(51) Int. Cl.
G06F 8/65 (2018.01)
H04L 12/40 (2006.01)
(52) U.S. Cl.
CPC ................ G06F 8/65 (2013.01); H04L 12/40 (2013.01); H04L 2012/40273 (2013.01)
(58) Field of Classification Search
CPC .. G06F 8/65; H04L 12/40; H04L 2012/40273
(Continued)

(56) References Cited

U.S. PATENT DOCUMENTS

2006/0200658 A1* 9/2006 Penkethman ..... H04M 1/72406
713/2
2008/0005733 A1* 1/2008 Ramachandran ......... G06F 8/65
717/168
(Continued)

FOREIGN PATENT DOCUMENTS

JP 08-237208 A 9/1996
JP 2003-337723 A 11/2003
(Continued)

OTHER PUBLICATIONS

Daimi et al, "Securing Vehicle ECUs Update Over The Air", 2016, [Online], pp. 45-50, [Retrieved from internet on Jul. 25, 2022], <http://personales.upv.es/thinkmind/dl/conferences/aict/aict_2016/aict_2016_3_10_10003.pdf> (Year: 2016).*
(Continued)

Primary Examiner — S. Sough
Assistant Examiner — Zengpu Wei
(74) Attorney, Agent, or Firm — Volpe Koenig

(57) ABSTRACT

A control apparatus includes a reception unit which receives distribution data which contains compressed update data and a header which includes information to designate any one of a plurality of update systems, a decompression unit which decompresses the update data from the distribution data received by the reception unit, and a restoration unit which restores a new program after updating according to an update system designated in the header using the update data decompressed by the decompression unit. The decompression unit switches a decompression method when the update data is decompressed on the basis of the update system designated in the header.

14 Claims, 21 Drawing Sheets

(58) Field of Classification Search
USPC .......................................................... 717/170
See application file for complete search history.

(56) References Cited

U.S. PATENT DOCUMENTS

| | | |
|---|---|---|
| 2010/0246983 A1 | 9/2010 | Hosokawa |
| 2013/0262408 A1* | 10/2013 | Simmen ................ G06F 16/258 |
| | | 707/693 |
| 2015/0220320 A1* | 8/2015 | Chen .......................... G06F 8/65 |
| | | 717/170 |
| 2016/0006456 A1* | 1/2016 | Muramatsu ............. H03M 7/40 |
| | | 707/693 |
| 2016/0313989 A1* | 10/2016 | Chen ........................ G06F 8/658 |
| 2018/0018160 A1 | 1/2018 | Teraoka et al. |
| 2018/0048473 A1* | 2/2018 | Miller ........................ H04L 9/14 |
| 2018/0196660 A1* | 7/2018 | Rivas Silva ........... H04H 20/62 |

FOREIGN PATENT DOCUMENTS

| | | |
|---|---|---|
| JP | 2004-170887 A | 6/2004 |
| JP | 4888566 B2 | 2/2012 |
| JP | 2016-170740 A | 9/2016 |

OTHER PUBLICATIONS

International Search Report, PCT/JP2018/010857, dated Jun. 19, 2018, 2 pgs.

* cited by examiner

BLOCK DIAGRAM OF HARDWARE CONFIGURATION OF SERVER

BLOCK DIAGRAM OF FUNCTIONAL CONFIGURATION
OF PROGRAM DISTRIBUTION SOFTWARE

BLOCK DIAGRAM OF INNER CONFIGURATION OF DATA COMPRESSION UNIT

BLOCK DIAGRAM OF HARDWARE CONFIGURATION
OF PROGRAM UPDATE APPARATUS

BLOCK DIAGRAM OF FUNCTIONAL CONFIGURATION
OF PROGRAM UPDATE MANAGEMENT SOFTWARE

BLOCK DIAGRAM OF HARDWARE CONFIGURATION OF ECU

BLOCK DIAGRAM OF FUNCTIONAL CONFIGURATION OF PROGRAM RESTORATION SOFTWARE

COMPRESSION ENCODING OF DIFFERENTIAL UPDATE SYSTEM

COMPRESSION ENCODING OF COMPRESSION UPDATE SYSTEM

DATA STRUCTURE OF "DATA TRANSFER START REQUEST COMMAND"

DATA STRUCTURE OF "TRANSFER START ACCEPTANCE RESPONSE COMMAND"

DATA STRUCTURE OF "DISTRIBUTION DATA TRANSFER COMMAND"

DATA STRUCTURE OF "RECEPTION RESPONSE COMMAND"

DATA STRUCTURE OF "TRANSFER COMPLETION NOTIFICATION COMMAND"/ "TRANSFER COMPLETION ACCEPTANCE RESPONSE COMMAND"

BLOCK DIVISION OF DISTRIBUTION DATA

DECOMPRESSION/RESTORATION PROCESS

DECOMPRESSION/RESTORATION PROCESS OF DIFFERENTIAL UPDATE SYSTEM

CONTROL APPARATUS, PROGRAM UPDATE SYSTEM, AND PROGRAM UPDATE METHOD

TECHNICAL FIELD

The present invention relates to a control apparatus, a program update system, and a program update method.

BACKGROUND ART

In recent years, various electronic control units (ECU) are mounted in automobiles. Each ECU performs various programs and conducts communication through an in-vehicle network such as a CAN (Controller Area Network) to realize various functions related to the operation of the automobile.

Conventionally, as a reprogramming method for updating programs of these ECUs, there is proposed a method in which a new program is transmitted to each ECU through the CAN and stored in a non-volatile memory in each ECU. However, some of various ECUs mounted on the automobiles are increasing in number of programs due to the multi-function of the automobile and the increase of various types of sensors mounted on the automobile. Such an ECU has a problem in that it takes a long time for reprogramming (hereinafter, referred to as "reprogramming time").

In order to shorten the reprogramming time of the ECU, PTL 1 conceives a method for switching an update system to be applied in the reprogramming of each ECU according to a difference of the update system of the program to which each ECU can handle and according to a status of each ECU. The update system includes a "compression update system" for dividing data of a new program by fixed sizes and compressing the respective divided data to be transmitted to the ECU, and a "differential update system" for compressing differential data between an old program already stored in the ECU and the new program to be transmitted to the ECU. In the method of PTL 1, the total amount of data to be transmitted to the ECU is reduced by applying these update systems, thereby shortening the reprogramming time of the ECU.

In addition, in relation to the shortening of the reprogramming time of the ECU, an approach for increasing the compression rate of transmission data is proposed in PTL 2. Data compression by a so-called dictionary compression method such as LZ77 generally increases the compression rate of data by expanding the size of a reference dictionary referred to find an existing pattern in a data stream. In the method of PTL 2, the compression rate is enhanced by dividing the data stream into a series of block groups and compressing a target block using the target block to be compress and a compression result of the block group ahead of the target block as a reference dictionary.

CITATION LIST

Patent Literature

PTL 1: JP 2016-170740 A
PTL 2: JP 4888566 B2

SUMMARY OF INVENTION

Technical Problem

There is a need to provide a decompression buffer for temporarily storing decompressed data on a volatile memory in order to decompress the compressed data in the device which receives the compressed data. In the conventional method described in PTL 2, the size of the reference dictionary used in compression is set according to the capacity of the decompression buffer. However, in a device mounted on an automobile such as an ECU, there is generally little margin in hardware resources and the capacity of a volatile memory usable as the decompression buffer is small. Therefore, the size of the reference dictionary is not possible to be made too large, and it is difficult to increase the compression rate. In such a conventional method, the speed-up of the program update is insufficient in a case where the program update is performed by switching a plurality of update systems as described in PTL 1.

Solution to Problem

A control apparatus according to a first aspect of the invention includes a reception unit which receives distribution data which contains compressed update data and a header which includes information to designate any one of a plurality of update systems, a decompression unit which decompresses the update data from the distribution data received by the reception unit, and a restoration unit which restores a new program after updating according to an update system designated in the header using the update data decompressed by the decompression unit. The decompression unit switches a decompression method when the update data is decompressed on the basis of the update system designated in the header.

A program update system according to a second aspect of the invention includes a server and a control apparatus which are connected to each other through a network. The server includes a data compression unit which generates compressed update data according to any one of a plurality of update systems, and a transmission unit which transmits distribution data to the control apparatus through the network, the distribution data containing the update data and a header which includes information to designate the update system to be used for generating the update data. The control apparatus includes a reception unit which receives the distribution data, a decompression unit which decompresses the update data from the distribution data received by the reception unit, and a restoration unit which restores a new program after updating according to the update system designated in the header using the update data decompressed by the decompression unit. The decompression unit switches a decompression method when decompressing the update data on the basis of the update system designated in the header.

A program update method according to a third aspect of the invention is a method for updating a program of a control apparatus. In the method, the control apparatus receives distribution data which contains compressed update data and a header which includes information to designate any one of a plurality of update systems. The control apparatus switches a decompression method on the basis of the update system designated in the header to decompress the update data from the received distribution data. The control apparatus restores a new program after updating according to the update system designated in the header using the decompressed update data.

Advantageous Effects of Invention

According to the invention, a program can be updated at a high speed even if a control apparatus has a small capacity of a volatile memory.

DESCRIPTION OF EMBODIMENTS

Figure 1:
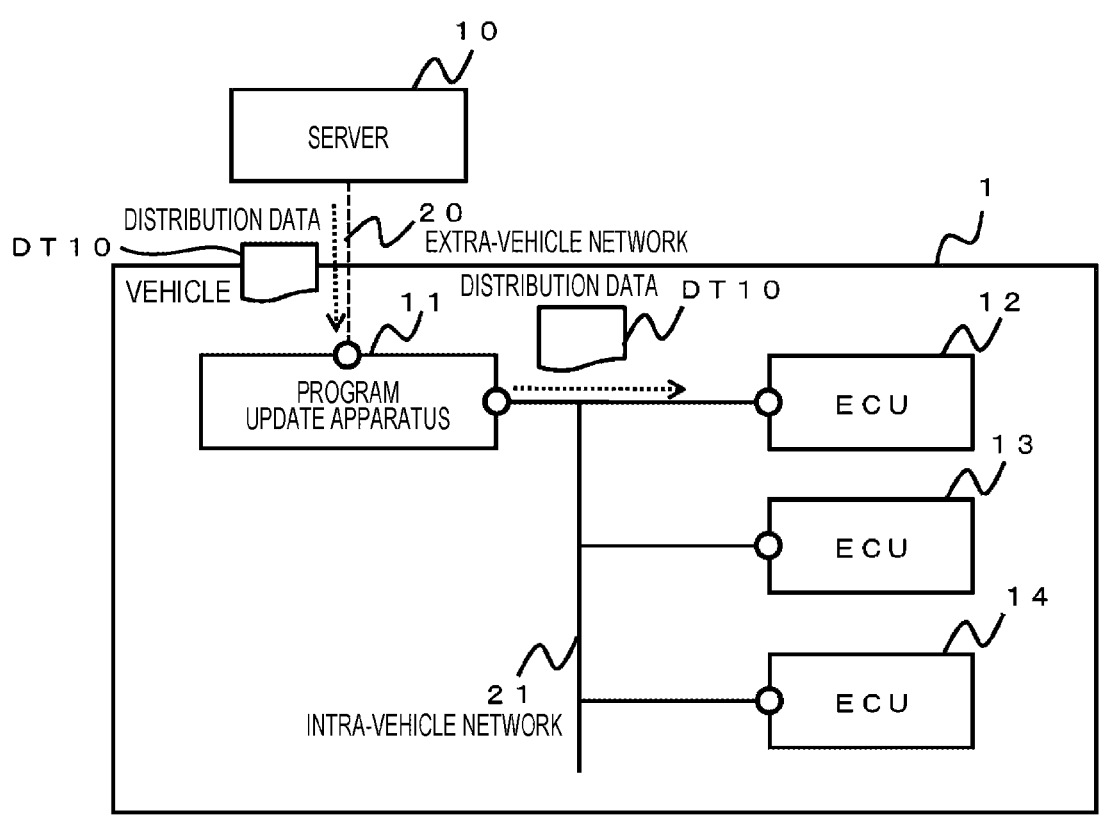
FIG. 1 is a block diagram illustrating an exemplary configuration of a program update system according to a first embodiment of the invention.

Hereinafter, embodiments of the invention will be described using the drawings. Further, the same symbol in the drawings indicates the same or corresponding portion. In addition, the invention is not limited to the illustrated examples.

First Embodiment

A first embodiment will be described about a program update method of an in-vehicle ECU in the invention. Further, the description in the following will be given about a case where the program of the ECU is updated. However, the present technology is applicable generally to information which is required for the control of the ECU including a program such as various types of parameters and data.

FIG. 1 is a block diagram illustrating an exemplary configuration of a program update system according to the first embodiment of the invention. The program update system illustrated in FIG. 1 is configured by a server 10, and a program update apparatus 11 and a plurality of ECUs 12, 13, and 14 which are mounted in a vehicle 1. The server 10 and the program update apparatus 11 are connected to each other through an extra-vehicle network 20 (for example, the Internet, etc.), and the program update apparatus 11 and the ECUs are connected to each other through an intra-vehicle network 21 (for example, CAN, etc.). In other words, the server 10 and the ECUs are connected to each other through a network (hereinbelow, referred to as a distribution network) which is configured by the extra-vehicle network 20, the program update apparatus 11, and the intra-vehicle network 21.

The server 10 distributes distribution data DT10 to each ECU in the vehicle 1 which is data required for updating a control program of each ECU. The program update apparatus 11 is a network relay apparatus between the server 10 and the ECUs, and serves as a part of the distribution network. The program update apparatus 11 receives the distribution data DT10 distributed from the server 10 through the extra-vehicle network 20, and temporarily stores the data. Then, the stored distribution data DT10 is transferred to ECUs which are distribution targets of the distribution data DT10 through the intra-vehicle network 21. Each ECU receives the distribution data DT10 transferred from the program update apparatus 11, and stores the data in its own memory. After the control program is updated, an updated program is applied at a predetermined timing such as rebooting.

Figure 2:
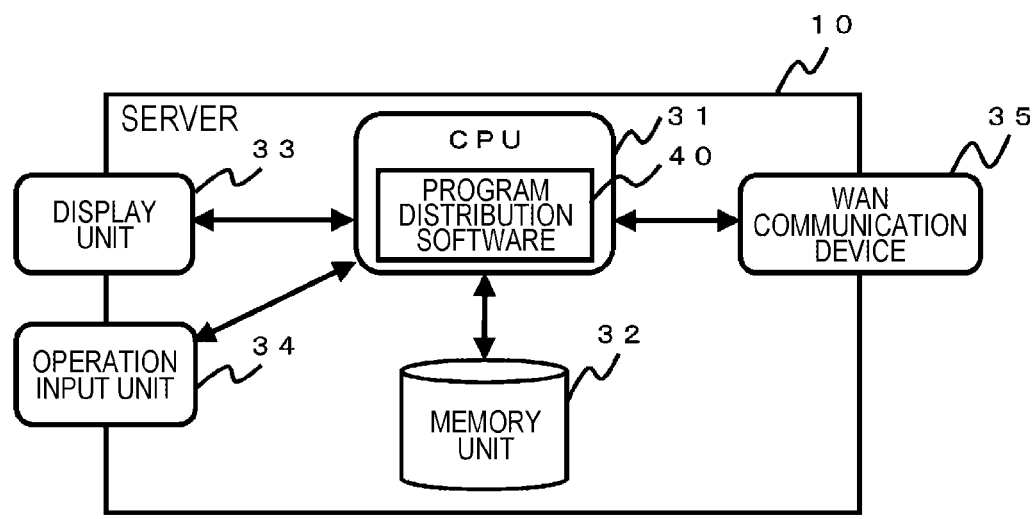
FIG. 2 is a block diagram illustrating an exemplary hardware configuration of a server.

FIG. 2 is a block diagram illustrating an exemplary hardware configuration of the server 10. As illustrated in FIG. 2, the server 10 includes a CPU 31, a memory unit 32, a display unit 33, an operation input unit 34, and a WAN communication device 35.

The CPU 31 is a calculation processing device which operates a program distribution software 40. The memory unit 32 is configured by a volatile memory and a non-volatile memory, and stores various data required for the process of the program distribution software 40. The display unit 33 and the operation input unit 34 is a display or an input interface which is used when a user operates the server 10. The WAN communication device 35 communicates with the vehicle 1 through the extra-vehicle network 20.

Further, the server 10 does not require a user's operation necessarily, but the program distribution software 40 may be automatically activated to create and distribute the distribution data DT10 for updating the program of each ECU of the vehicle 1. In addition, the server 10 may be configured by one unit, or may cooperate with plural units to realize the same function.

Figure 3:
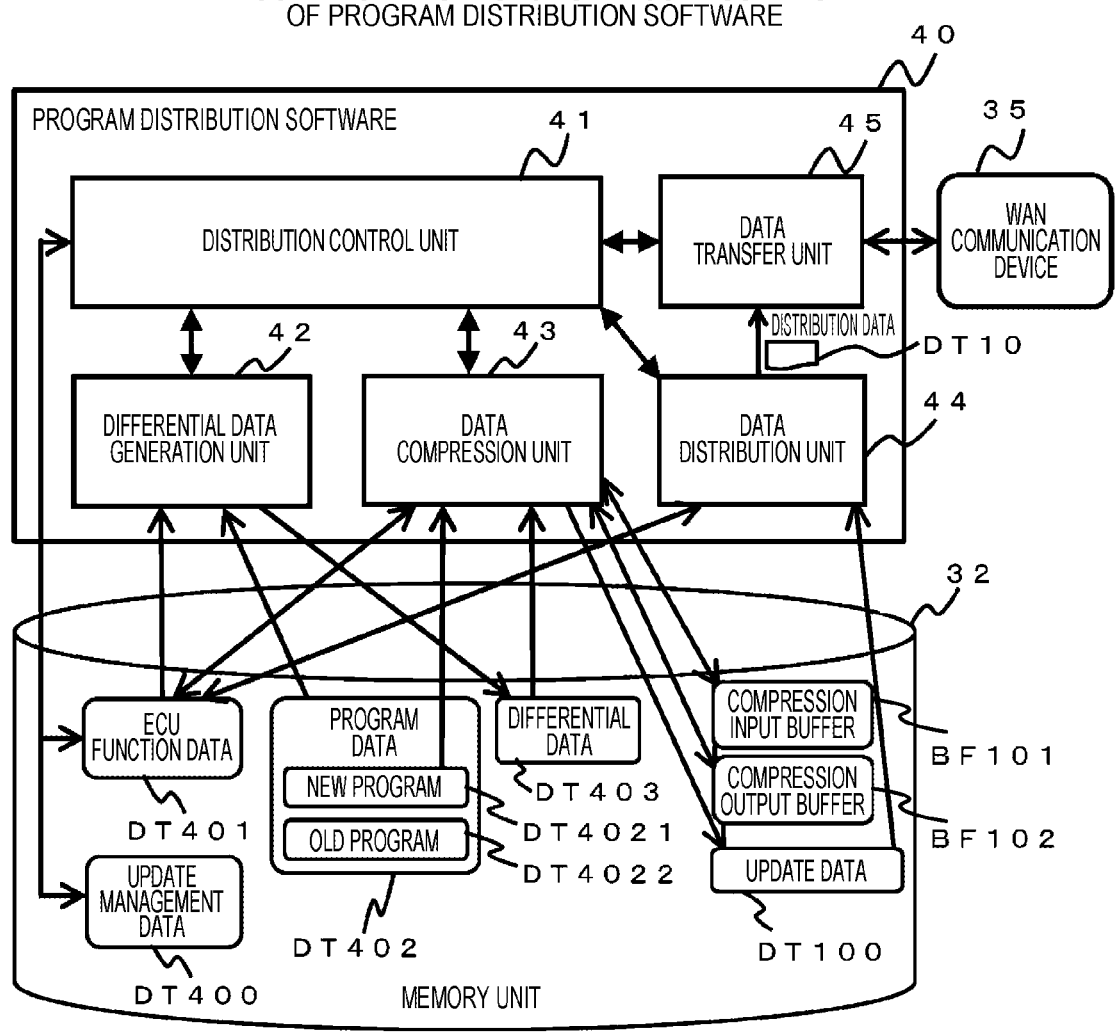
FIG. 3 is a block diagram illustrating an exemplary configuration of a function of a program distribution software operating on a CPU of the server.

FIG. 3 is a block diagram illustrating an exemplary configuration of a function of the program distribution software 40 operating on the CPU 31 of the server 10. Further, in this block diagram, the functions of the program distribution software 40 are illustrated as functional blocks divided according to the types of the functions. However, the functional blocks may be divided still more, or a plurality of functional blocks may be combined. In addition, the program distribution software 40 is not necessary to be realized by one program, but may be realized by two or more program combinations.

The program distribution software 40 includes the functional blocks of a distribution control unit 41, a differential data generation unit 42, a data compression unit 43, a data distribution unit 44, and a data transfer unit 45. In the server 10, when the program distribution software 40 is performed by the CPU 31, the functional blocks are realized by the CPU 31. In other words, when the program distribution software 40 is performed by the CPU 31, the server 10 can operate as including the distribution control unit 41, the differential data generation unit 42, the data compression unit 43, the data distribution unit 44, and the data transfer unit 45.

In the memory unit 32, update management data DT400, ECU function data DT401, program data DT402, differential data DT403, and update data DT100 are stored as data to be handled by the program distribution software 40. In addition, a compression input buffer BF101 and a compression output buffer BF102 are provided as work areas used at the time of data compression. The program data DT402 is configured by new program data DT4021 and old program data DT4022. The functional blocks of the program distribution software 40 read and write their data with respect to the memory unit 32.

The update management data DT400 is information to manage a program update status of each ECU. The update management data DT400 contains information such as a generation status, a distribution schedule, and a distribution completion status of the update data of each ECU. The program distribution software 40 generates the differential data DT403, generates the update data DT100, and determines an execution such as a distribution of the distribution data DT10 on the basis of the update management data DT400.

The ECU function data DT401 contains information related to an update system corresponding to each ECU, and resources of each ECU such as a RAM capacity and a ROM capacity which are available when each ECU decompresses the update data. The distribution data DT10 can be distributed from the server 10 with efficiency by checking these resources.

Further, it is assumed in the program update system of this embodiment that each ECU corresponds to at least any one of three update systems of "a total update system", "a differential update system", and "a compression update system". The total update system is an update system in which the new program data DT4021 is used as it is without compression, and the distribution data DT10 based on the update data DT100 is distributed from the server 10 to each ECU. The differential update system is an update system in which the differential data DT403 is compressed on the basis of a differential between the old program data DT4022 and the new program data DT4021 to generate the update data DT100, and the distribution data DT10 based on the update data is distributed from the server 10 to each ECU. The compression update system is an update system in which the new program data DT4021 is compressed to generate the update data DT100, and the distribution data DT10 based on the update data is distributed from the server 10 to each ECU. The differential update system and the compression update system will be described in detail below.

The program data DT402 contains the new program data DT4021 which is new program data to be distributed to each ECU, and the old program data DT4022 which is program data before update which is used already in each ECU. The program data may be individually used for each ECU, and may be data shared among the plurality of ECUs. In addition, data other than the program (for example, various types of parameters, data, and setting data) may be included.

The differential data DT403 extracts a data difference between the old program data DT4022 and the new program data DT4021 when updating the program by the differential update system. If there is a difference only in a specific data when comparing the program data, the difference is extracted as the differential data DT403, and stored in association with position information (for example, a start position and a data length) of the data string where the difference occurs. In a case where the difference between the old program data DT4022 and the new program data DT4021 is small, only the differential data DT403 is transmitted to the ECU of the update target by the differential update system instead of transmitting the new program data DT4021 to all the ECUs of the update target by the compression update system, and the differential is applied to the old program data DT4022 already stored in the ECU, so that the new program data DT4021 can be restored with efficiency.

The update data DT100 is data which is based on the distribution data DT10 distributed from the server 10 to each ECU. As described above, in the case of the total update system, the new program data DT4021 becomes the update data DT100 with compression. On the other hand, in the case of the compression update system, the new program data DT4021 is compressed, but is generated as the update data DT100. In addition, in the case of the differential update system, the differential data DT403 is compressed, and is generated as the update data DT100.

Subsequently, each functional block of the server 10 realized by the program distribution software 40 will be described.

The distribution control unit 41 controls the operations of the functional blocks in the program distribution software 40. When the other functional blocks operate according to the control of the distribution control unit 41, the differential data DT403 and the update data DT100 are generated, and the distribution data DT10 is distributed from the server 10 to each ECU through the distribution network.

The differential data generation unit 42 generates the differential data DT403 from the new program data DT4021 and the old program data DT4022 stored in the memory unit 32.

The data compression unit 43 compresses the new program data DT4021 or the differential data DT403 read from the memory unit 32, and generates the update data DT100. At this time, the data compression unit 43 compresses the new program data DT4021 or the differential data DT403 using the compression input buffer BF101 and the compression output buffer BF102 as work areas. Further, the details of a data compression of the data compression unit 43 will be described below with reference to FIG. 12.

The data distribution unit 44 reads the update data DT100 stored in the memory unit 32, generates the distribution data DT10 on the basis of the update data, and outputs the distribution data to the data transfer unit 45.

If the distribution data DT10 is output from the data distribution unit 44, the data transfer unit 45 outputs and transmits the distribution data DT10 to the WAN communication device 35. With this configuration, the data transfer unit 45 transmits the distribution data DT10 to the vehicle 1 through the extra-vehicle network 20 using the WAN communication device 35.

Figure 4:
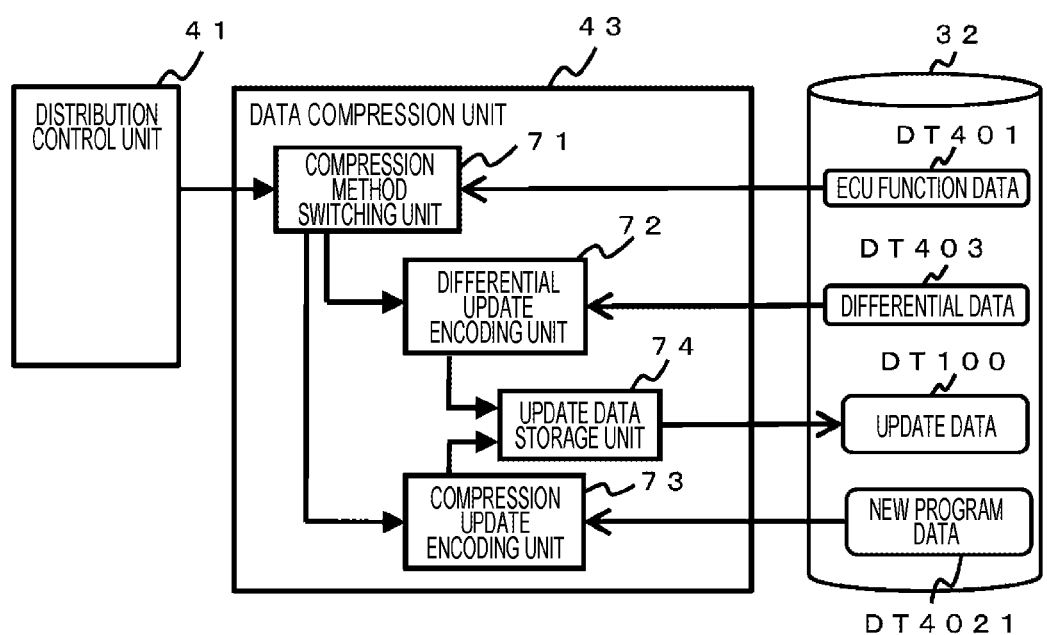
FIG. 4 is a block diagram illustrating an exemplary internal configuration of software of a data compression unit operating in the server.

FIG. 4 is a block diagram illustrating an exemplary internal configuration of software of the data compression unit 43 operating in the server 10. The data compression unit 43 is configured by a compression method switching unit 71, a differential update encoding unit 72, a compression update encoding unit 73, and an update data storage unit 74.

The compression method switching unit 71 is a determination unit which switches a compression method based on the update system. If an instruction of the data compression is received from the distribution control unit 41, the compression method switching unit 71 reads the ECU function data DT401 from the memory unit 32, and checks whether the update system corresponding to the update target ECU is any one of the differential update system and the compression update system. Then, the compression method is switched by selecting any one of the differential update encoding unit 72 and the compression update encoding unit 73 on the basis of the confirmed update system. Further, in a case where the update system corresponding to the update target ECU is the total update system, the compression is not necessary in generating the update data DT100, and thus the instruction of the data compression is not output from the distribution control unit 41. Therefore, none of the differential update encoding unit 72 and the compression update encoding unit 73 is selected.

When the update system is the differential update system, the differential update encoding unit 72 is selected by the compression method switching unit 71 and receives a compression encoding instruction. If the compression encoding instruction is received, the differential update encoding unit 72 reads the differential data DT403 from the memory unit 32, and compresses and encodes the data.

When the update system is the compression update system, the compression update encoding unit 73 is selected by the compression method switching unit 71 and receives the compression encoding instruction. If the compression encoding instruction is received, the compression update encoding unit 73 reads the new program data DT4021 from the memory unit 32, and compresses and encodes the data.

The update data storage unit 74 stores the differential data DT403 compressed and encoded by the differential update encoding unit 72, or the new program data DT4021 compressed and encoded by the compression update encoding unit 73 in the memory unit 32 as the update data DT100.

In the data compression unit 43, the update data DT100 compressed according to the update system is generated through the operation of each functional block described above.

Figure 5:
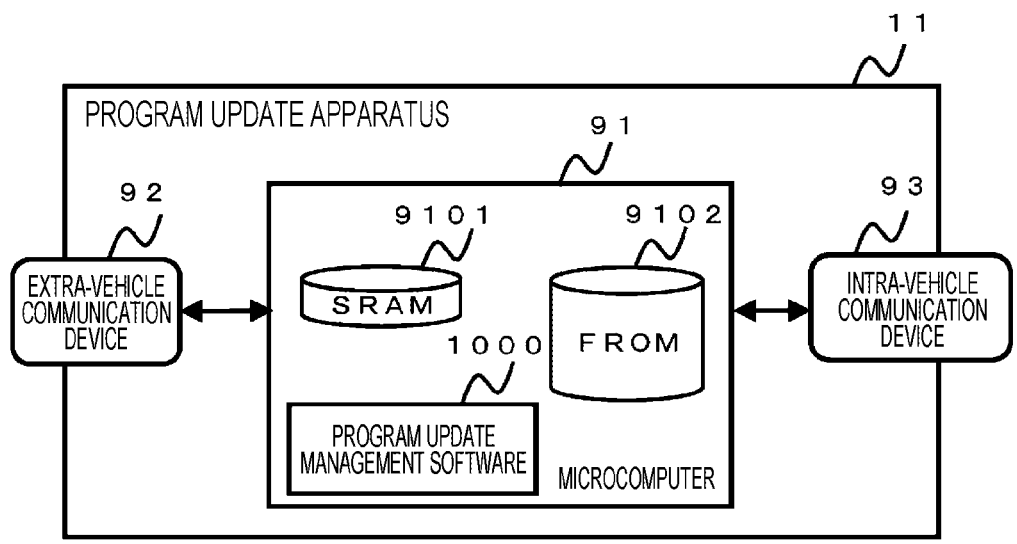
FIG. 5 is a block diagram illustrating an exemplary hardware configuration of a program update apparatus.

FIG. 5 is a block diagram illustrating an exemplary hardware configuration of the program update apparatus 11. As illustrated in FIG. 5, the program update apparatus 11 includes a microcomputer 91, an extra-vehicle communication device 92, and an intra-vehicle communication device 93.

The microcomputer 91 is a calculation processing device which operates a program update management software 1000. The microcomputer 91 includes an SRAM 9101 (volatile memory) and an FROM 9102 (non-volatile memory) built therein. The extra-vehicle communication device 92 is connected to the server 10 through the extra-vehicle network 20, receives the distribution data DT10 distributed from the server 10, and outputs the distribution data to the microcomputer 91. The intra-vehicle communication device 93 is connected to each ECU through the intra-vehicle network 21, and transfers the distribution data DT10 to each ECU which is distributed from the server 10 and output from the microcomputer 91. With this configuration, the program update apparatus 11 serves as a network relay apparatus between the server 10 and each ECU.

Figure 6:
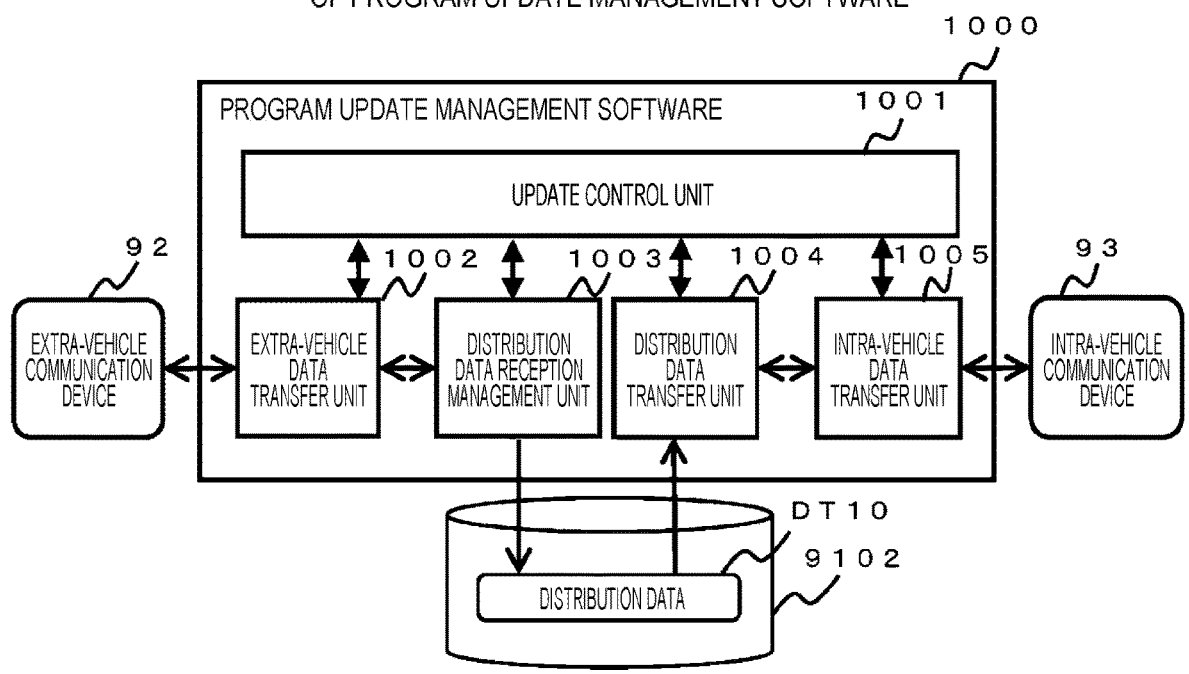
FIG. 6 is a block diagram illustrating an exemplary configuration of a function of a program update management software operating on a microcomputer of the program update apparatus.

FIG. 6 is a block diagram illustrating an exemplary configuration of a function of the program update management software 1000 operating on the microcomputer 91 of the program update apparatus 11. Further, in this block diagram, the functions of the program update apparatus 11 are illustrated as functional blocks divided according to the types of the functions. However, the functional blocks may be divided still more, or a plurality of functional blocks may be combined. In addition, the program update management software 1000 is not necessary to be realized by one program, but may be realized by two or more program combinations.

The program update management software 1000 includes the functional blocks of an update control unit 1001, an extra-vehicle data transfer unit 1002, a distribution data reception management unit 1003, a distribution data transfer unit 1004, and an intra-vehicle data transfer unit 1005. In the program update apparatus 11, when the program update management software 1000 is performed by the microcomputer 91, the functional blocks are realized by the microcomputer 91. In other words, when the program update management software 1000 is performed by the microcomputer 91, the program update apparatus 11 can operate as including the update control unit 1001, the extra-vehicle data transfer unit 1002, the distribution data reception management unit 1003, the distribution data transfer unit 1004, and the intra-vehicle data transfer unit 1005.

The description will be given about the functional blocks of the program update apparatus 11 which is realized by the program update management software 1000.

The update control unit 1001 controls the operations of the functional blocks in the program update management software 1000. When the other functional blocks operate according to the control of the update control unit 1001, the distribution data DT10 distributed from the server 10 is relayed and transferred to each ECU.

The extra-vehicle data transfer unit 1002 receives the distribution data DT10 which is transmitted toward each ECU (the ECU 12, etc.) from the server 10 connected through the extra-vehicle communication device 92.

The distribution data reception management unit 1003 records the distribution data DT10 of each ECU received by the extra-vehicle data transfer unit 1002 to the FROM 9102.

The distribution data transfer unit 1004 reads the distribution data DT10 stored in the FROM 9102, outputs the distribution data to the intra-vehicle data transfer unit 1005 to issue a data transfer instruction.

If the distribution data DT10 is output from the distribution data transfer unit 1004, the intra-vehicle data transfer unit 1005 outputs and transmits the distribution data DT10 to the intra-vehicle communication device 93. With this configuration, the intra-vehicle data transfer unit 1005 transfers the distribution data DT10 to the destination ECU (update target) through the intra-vehicle network 21 using the intra-vehicle communication device 93.

Figure 7:
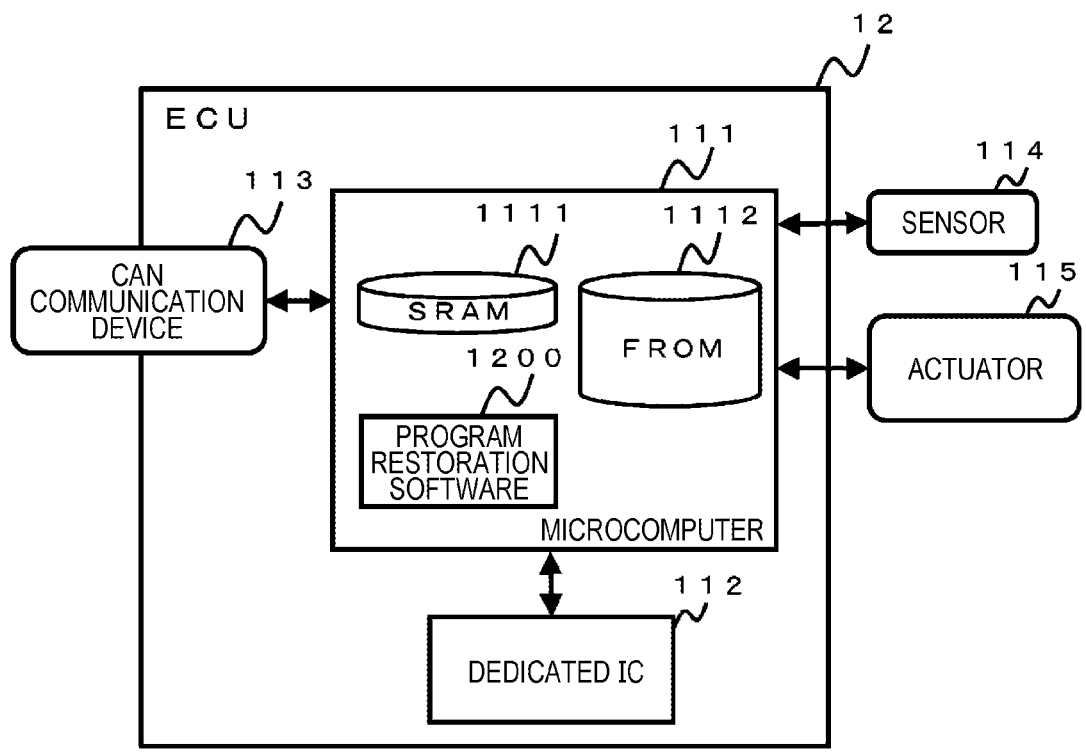
FIG. 7 is a block diagram illustrating an exemplary hardware configuration of an ECU.

FIG. 7 is a block diagram illustrating an exemplary hardware configuration of the ECU 12. As illustrated in FIG. 7, the ECU 12 includes a microcomputer 111, a dedicated IC 112, and a CAN communication device 113, and is connected to a sensor 114 and an actuator 115. Further, the other ECUs 13 and 14 have the similar configuration to the ECU 12, and thus the configuration of the ECUs below will be described using the ECU 12 as a representative example.

The microcomputer 111 is a calculation processing device which operates a program restoration software 1200. The microcomputer 111 includes an SRAM 1111 (volatile memory) and an FROM 1112 (non-volatile memory) built therein. The dedicated IC 112 is a circuit which performs various types of processes and operations to realize the functions of the ECU 12 in cooperation with the microcomputer 111 and, for example, is configured by an ASIC (Application Specific Integrated Circuit). The sensor 114 acquires sensor information to realize the functions of the ECU 12, and outputs the information to the microcomputer 111. The actuator 115 is configured by a motor for example, and operates according to the control of the microcomputer 111. Further, the ECU 12 may be not provided with the dedicated IC 112, and may be not connected to the sensor 114 and the actuator 115. The CAN communication device 113 is connected to the program update apparatus 11 and the other ECUs through the intra-vehicle network 21, and receives the distribution data DT10 transferred from the program update apparatus 11 or transfers various types of information related to the operation of the vehicle 1 with respect to the other ECUs.

Figure 8:
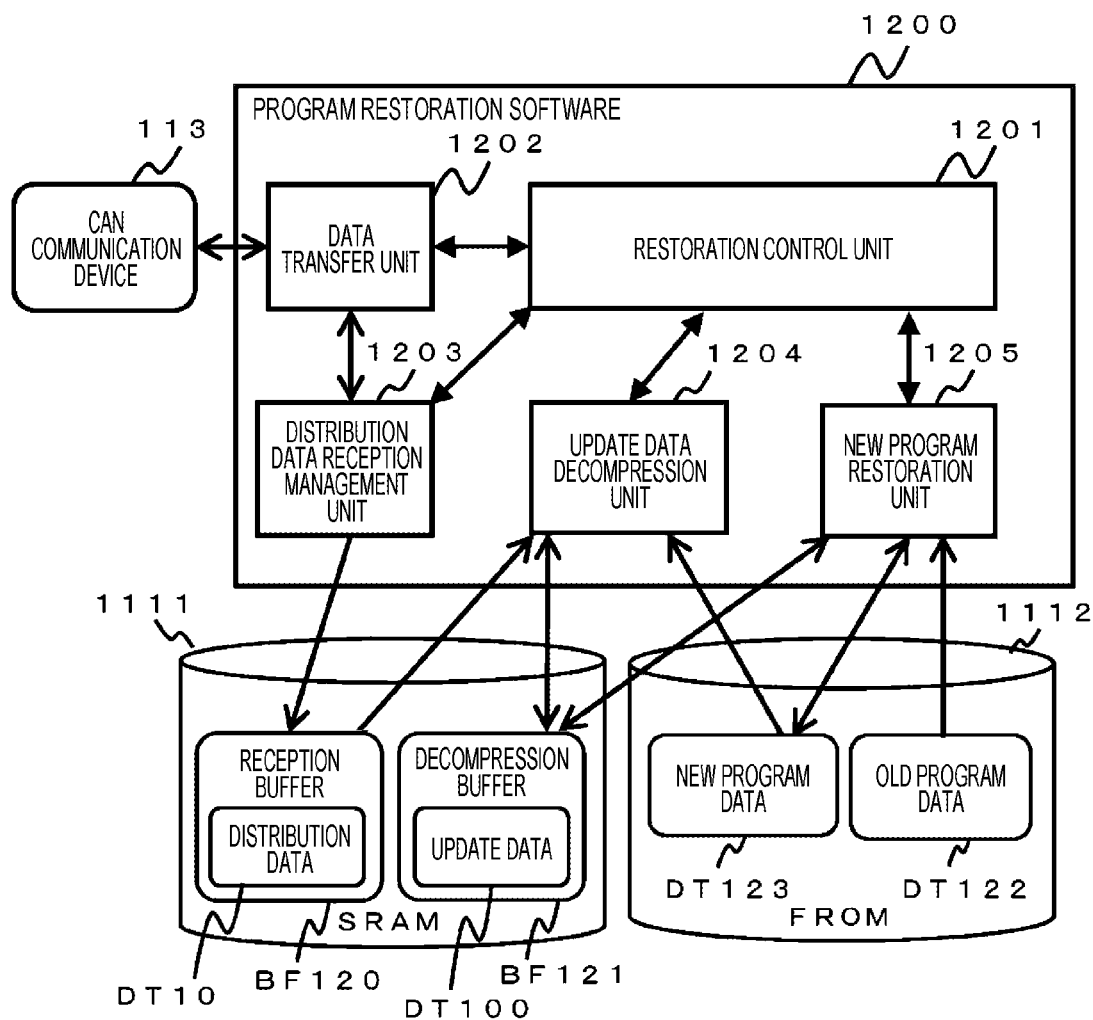
FIG. 8 is a block diagram illustrating an exemplary configuration of a function of a program restoration software according to the first embodiment of the invention operating on the microcomputer of the ECU.

FIG. 8 is a block diagram illustrating an exemplary configuration of a function of a program restoration software 1200 according to the first embodiment of the invention operating on the microcomputer 111 of the ECU 12. Further, in this block diagram, the functions of the ECU 12 are illustrated as functional blocks divided according to the types of the functions. However, the functional blocks may be divided still more, or a plurality of functional blocks may be combined. In addition, the program restoration software 1200 is not necessary to be realized by one program, but may be realized by two or more program combinations.

The program restoration software 1200 includes the functional blocks of a restoration control unit 1201, a data transfer unit 1202, a distribution data reception management unit 1203, an update data decompression unit 1204, and a new program restoration unit 1205. In the ECU 12, when the program restoration software 1200 is performed by the microcomputer 111, these functional blocks are realized by the microcomputer 111. In other words, when the program restoration software 1200 is performed by the microcomputer 111, the ECU 12 can operate as including the restoration control unit 1201, the data transfer unit 1202, the distribution data reception management unit 1203, the update data decompression unit 1204, and the new program restoration unit 1205.

Each functional block of the ECU 12 realized by the program restoration software 1200 will be described.

The restoration control unit 1201 controls the operations of the functional blocks in the program restoration software 1200. When the other functional blocks operate according to the control of the restoration control unit 1201, the program of the ECU 12 is updated using the distribution data DT10 which is distributed from the server 10 and related by the program update apparatus 11.

The data transfer unit 1202 operates the CAN communication device 113 according to the instruction from the restoration control unit 1201, and transfers the data with respect to the other devices connected through the intra-vehicle network 21 (that is, between the program update apparatus 11 and the ECUs 13 and 14). If the distribution data DT10 is transmitted from the program update apparatus 11 to the ECU 12, the distribution data DT10 is received by the data transfer unit 1202 using the CAN communication device 113.

The distribution data reception management unit 1203 stores the distribution data DT10 received by the data transfer unit 1202 to a reception buffer BF120 which is provided on the SRAM 1111.

The update data decompression unit 1204 decompresses the update data DT100 from the distribution data DT10 which is stored in the reception buffer BF120, and stores the update data to a decompression buffer BF121 which is provided on the SRAM 1111.

The new program restoration unit 1205 restores new program data DT123 after update using the update data DT100 which is decompressed by the update data decompression unit 1204. At this time, as needed, old program data DT122 before update which is already stored in the FROM 1112 is used. Then, the restored new program data DT123 is stored in the FROM 1112 to update the program of the ECU 12.

Figure 9:
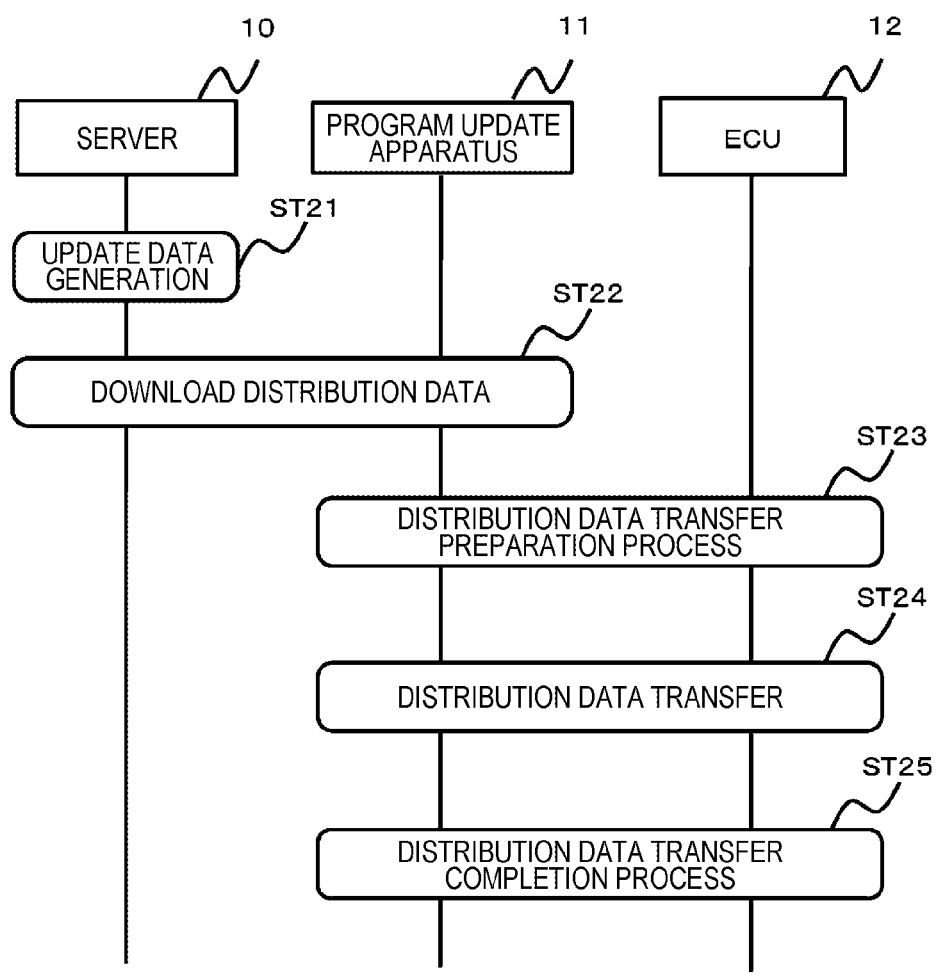
FIG. 9 is a sequence diagram illustrating the entire flow of a program update process in the program update system according to the first embodiment of the invention.

FIG. 9 is a sequence diagram illustrating the entire flow of a program update process in the program update system according to the first embodiment of the invention. Further, the description below will be given about a case where the program of the ECU 12 is updated as a representative example, but may be similarly applied even to a case where the programs of the other ECUs 13 and 14 are updated.

First, the server 10 performs an update data generation process in Step ST21 to generate the update data DT100 which is based on the distribution data DT10 distributed to the ECU 12. Further, the details of the update data generation process will be described with reference to FIG. 10 below.

Next, the server 10 generates the distribution data DT10 in Step ST22 on the basis of the update data DT100 which is generated in Step ST21 by the data distribution unit 44 and stored in the memory unit 32. Then, the distribution data DT10 is transmitted to the vehicle 1 by the data transfer unit 45. The program update apparatus 11 downloads the distribution data DT10 from the server 10, and stores the distribution data in the FROM 9102 of the program update apparatus 11.

Thereafter, the program update apparatus 11 performs a distribution data transfer preparation process in Step ST23 as a process before the distribution data DT10 downloaded in Step ST22 is transferred to the ECU 12. If the distribution data transfer preparation process of Step ST23 is completed, the program update apparatus 11 subsequently performs a distribution data transfer process in Step ST24 to transfer the distribution data DT10 to the ECU 12. If all the distribution data DT10 is completely transferred in Step ST24, the program update apparatus 11 performs a distribution data transfer completion process in Step ST25 as a post process. If the process of Step ST25 ends, the program update process of the ECU 12 is completed. Further, the details of the processes of Steps ST23 to ST25 will be described with reference to FIG. 13 below.

Figure 10:
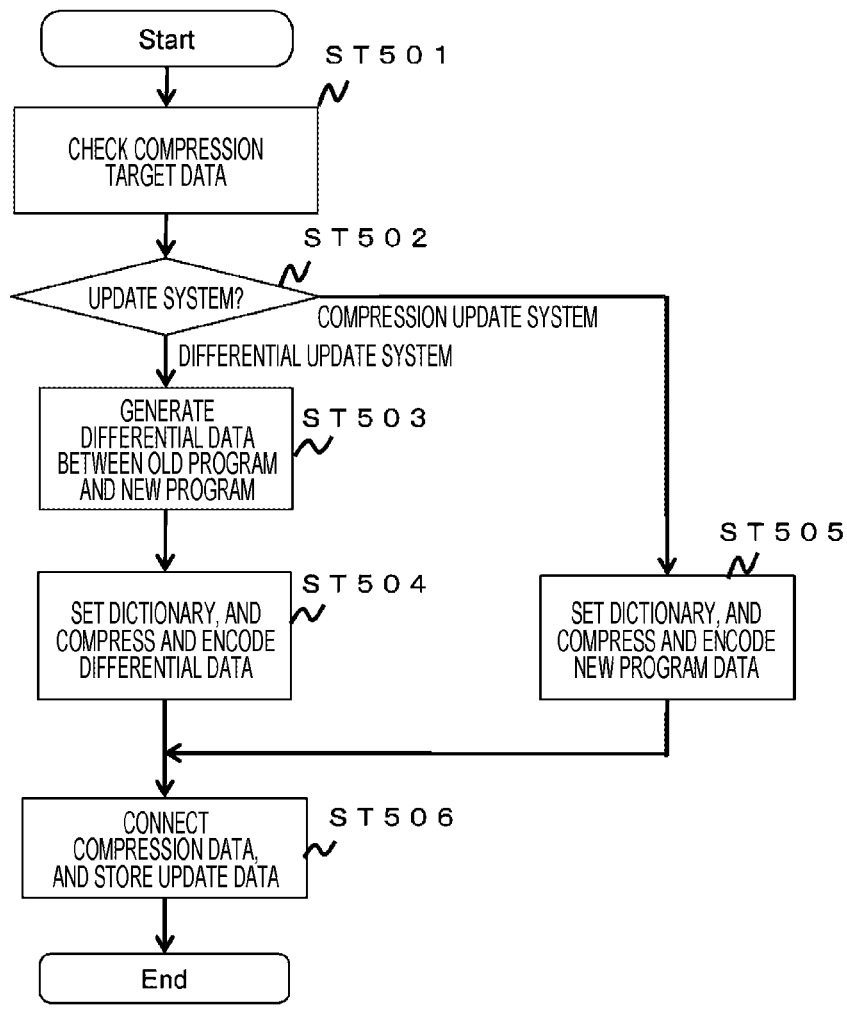
FIG. 10 is a flowchart illustrating a flow of an update data generation process performed by the server.

Herein, the details of the update data generation process performed in Step ST21 of FIG. 9 will be described. FIG. 10 is a flowchart illustrating a flow of the update data generation process which is performed by the server 10 in Step ST21.

In Step ST501, the distribution control unit 41 checks data which is a compression target. Specifically, the distribution control unit 41 reads the update management data DT400 stored in advance in the memory unit 32, and checks that the update target ECU is the ECU 12 and the update system corresponding to the ECU 12.

In Step ST502, the distribution control unit 41 determines whether the update system checked in Step ST501 is any one of the differential update system and the compression update system described above. As a result, in a case where the update system is the differential update system, the generation of the differential data DT403 is instructed to the differential data generation unit 42, and the process proceeds to Step ST503. On the other hand, in the case of the compression update system, the compression of the new program data DT4021 is instructed to the data compression unit 43, and the process proceeds to Step ST505. Further, in a case where the update system is not the differential update system nor the compression update system (for example, the total update system), the new program data DT4021 is stored as it is as the update data DT100 since the data compression is not necessary. The update data generation process of FIG. 10 ends. In addition, in a case where the ECU 12 corresponds to either one of the differential update system and the compression update system, it is determined in advance which update system is used, and the determination of Step ST502 may be performed according to the update system.

In Step ST503, the differential data generation unit 42 receives an instruction of the distribution control unit 41 to generate the differential data DT403 on the basis of a differential between the new program data DT4021 and the old program data DT4022 of the ECU 12 which are stored in the memory unit 32. Subsequently, the distribution control unit 41 instructs the data compression unit 43 to perform the data compression of the differential data DT403 generated by the differential data generation unit 42. In Step ST504, the data compression unit 43 receives an instruction from the distribution control unit 41 to perform the data compression of the differential data DT403 stored in the memory unit 32. At this time, the data compression unit 43 compresses the differential data DT403 using the differential update encoding unit 72 of FIG. 4. When the compression of the differential data DT403 is completed, the process proceeds to Step ST506.

In Step ST505, the data compression unit 43 receives an instruction from the distribution control unit 41 to perform the data compression of the new program data DT4021 stored in the memory unit 32. At this time, the data compression unit 43 compresses the new program data DT4021 using the compression update encoding unit 73 of FIG. 4. When the compression of the new program data DT4021 is completed, the process proceeds to Step ST506.

In Step ST506, the data compression unit 43 stores the data compressed in Step ST504 or ST505 in the memory unit 32 as the update data DT100 using the update data storage unit 74 of FIG. 4. When the update data DT100 is completely stored in Step ST506, the update data generation process of FIG. 10 ends.

Figure 11A:
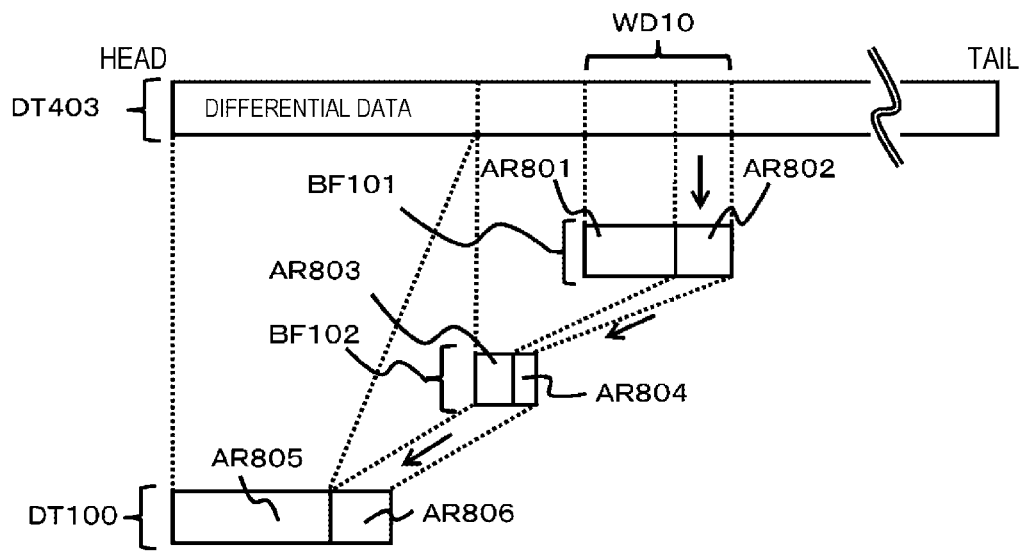
FIGS. 11A and 11B are diagrams for describing data compression in the data compression unit.

FIG. 11 is a diagram for describing the data compression in the data compression unit 43. FIG. 11A is a diagram for describing a compression encoding of the differential data DT403 in Step ST504 of FIG. 10 in a case where the update system is the differential update system. In this case, in the data compression unit 43, first the differential update encoding unit 72 reads a part of the data string (a reference portion AR801 and an encoding target portion AR802) of the differential data DT403 (compression source) from the memory unit 32, and stores the read data string in the compression input buffer BF101. Further, herein, a range of the data string stored in the compression input buffer BF101 will be called "sliding window". A sliding window WD10 of FIG. 11A represents a range of the data string. In other words, a range in the sliding window WD10 is divided into the reference portion AR801 and the encoding target portion AR802.

In the data compression of the differential update system, the size of the sliding window WD10 is set in accordance with the capacity of the decompression buffer BF121 which is provided on the SRAM 1111 in the ECU 12. In other words, the differential update encoding unit 72 determines the size of the sliding window WD10 to fall within the size of the range of the SRAM 1111 which is available as the decompression buffer BF121 for the ECU 12. Further, the capacity of the decompression buffer BF121 can be checked by referring the ECU function data DT401 which is stored in advance in the memory unit 32.

The differential update encoding unit 72 compresses and encodes the data string of the encoding target portion AR802 using an encoding algorithm such as LZ77. At this time, the data string of the reference portion AR801 is used as a dictionary for compressing and encoding the data string of the encoding target portion AR802. Specifically, the differential update encoding unit 72 searches the reference portion AR801 for the data string (referred to as a longest matching string) which is matched with a longest part of the data string of the encoding target portion AR802. If the longest matching string is found, the differential update encoding unit 72 replaces the data string corresponding to the longest matching string in the encoding target portion AR802 to a pointer to the longest matching string, and compresses and encodes the data string. The pointer contains information such as the position information and the data length of the longest matching string in the reference portion AR801. As the longest matching string becomes long, the data amount is reduced by the compression encoding so as to increase the compression rate. Thus, the data string generated by compressing and encoding the encoding target portion AR802 is stored in the compression output buffer BF102 as an encoded data string AR804. Further, in the compression output buffer BF102, an encoded data string AR803 compressed and encoded before the encoded data string AR804 is already stored.

The update data storage unit 74 stores the data string (the encoded data strings AR803 and AR804) accumulated in the compression output buffer BF102 so far in the memory unit 32 as partial update data AR806 (part of the update data DT100), for example, at a predetermined timing when the capacity of the compression output buffer BF102 is full. Further, partial update data AR805 generated before the partial update data AR806 is already stored in the memory unit 32.

The differential update encoding unit 72 first provides the sliding window WD10 at the head of the differential data DT403 to perform a compression encoding process and a storing process as described above. Thereafter, similarly the compression encoding process and the storing process are performed while the sliding window WD10 moves. In this way, the movement of the sliding window WD10, the compression encoding process, and the storing process are repeatedly performed from the head to the end of the differential data DT403. With this configuration, all the differential data DT403 is compressed and encoded so that the update data DT100 can be generated.

Figure 11B:
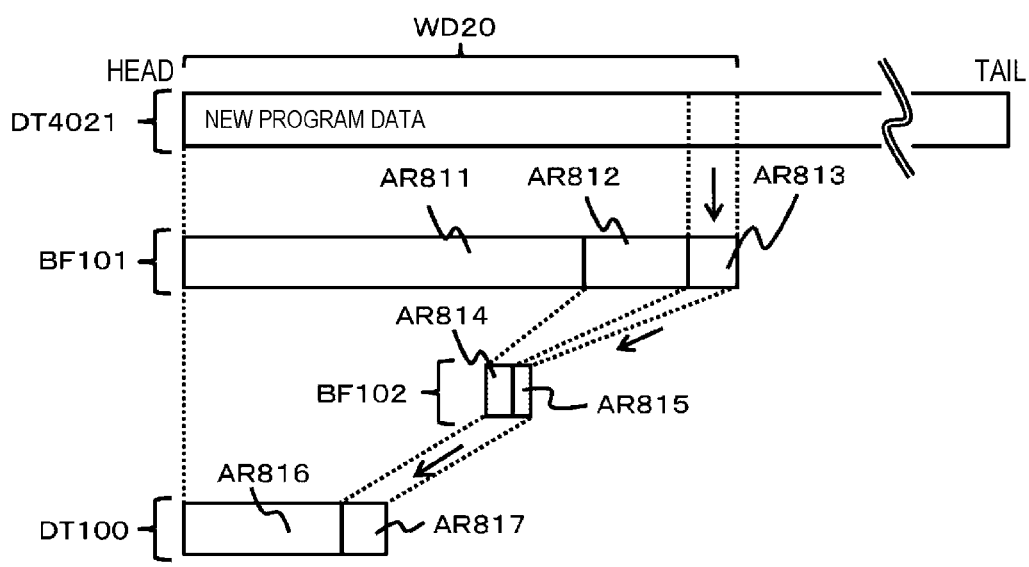

FIG. 11B is a diagram for describing the compression encoding of the new program data DT4021 which is performed in Step ST505 of FIG. 10 in a case where the update system is the compression update system. In this case, in the data compression unit 43, first the compression update encoding unit 73 reads a part of the data string (a reference portion AR811, a reference portion AR812, and an encoding target portion AR813) of the new program data DT4021 (compression source) from the memory unit 32, and stores the read data string in the compression input buffer BF101. A sliding window WD20 of FIG. 11B represents a range of the data string which is stored in the compression input buffer BF101 at that time. In other words, a range of the sliding window WD20 is divided into the reference portion AR811, the reference portion AR812, and the encoding target portion AR813.

In the data compression of the compression update system, the size of the sliding window WD20 is set to be larger than the capacity of the decompression buffer BF121 which is provided on the SRAM 1111 in the ECU 12. In other words, the compression update encoding unit 73 determines the size of the sliding window WD20 to be larger than the sliding window WD10 which is set by the differential update encoding unit 72 regardless of the size of the region of the SRAM 1111 which is available as the decompression buffer BF121 for the ECU 12.

The reference portion AR811 is a data string corresponding to partial update data AR816 which is already compressed, encoded, and stored in the memory unit 32. The reference portion AR812 is a data string corresponding to an encoded data string AR814 which is compressed and encoded but not yet stored in the memory unit 32. All the data strings are used as a dictionary for compressing and encoding the data string of the encoding target portion AR813. In other words, in a case where the compression update encoding unit 73 generates the update data DT100 according to the compression update system, the differential update encoding unit 72, a range of dictionary data becomes expanded rather than a case where the update data DT100 is generated according to the differential update system.

The compression update encoding unit 73 compresses and encodes the data string of the encoding target portion AR813 using an encoding algorithm such as LZ77 similarly to the compression encoding process of the differential update encoding unit 72. Specifically, the compression update encoding unit 73 searches the reference portion AR811 and the reference portion AR812 in the sliding window WD20 for the longest matching string to the data string of the encoding target portion 813. Then, the data string corresponding to the longest matching string in the encoding target portion 813 is replaced to the pointer to the longest matching string, and compressed and encoded. Thus, the data string generated by compressing and encoding the encoding target portion AR813 is stored in the compression output buffer BF102 as an encoded data string AR815. Further, in the compression output buffer BF102, the encoded data string AR814 compressed and encoded before the encoded data string AR815 is already stored.

The compression update encoding unit 73 stores the data string (the encoded data strings AR814 and AR815) accumulated in the compression output buffer BF102 so far in the memory unit 32 as partial update data AR817 (part of the update data DT100) at a predetermined timing similarly to the update data storage unit 74. Further, the partial update data AR816 generated before the partial update data AR817 is already stored in the memory unit 32.

The compression update encoding unit 73 first provides the sliding window WD20 at the head of the new program data DT4021 to perform the compression encoding process and the storing process as described above. Thereafter, similarly the compression encoding process and the storing process are performed while the sliding window WD20 moves. In this way, the movement of the sliding window WD20, the compression encoding process, and the storing process are repeatedly performed from the head to the end of the new program data DT4021. With this configuration, all the new program data DT4021 is compressed and encoded so that the update data DT100 can be generated.

Herein, in a case where the data size of the new program data DT4021 is larger than the capacity of the decompression buffer BF121 of the ECU 12, the size of the sliding window WD20 becomes larger than the capacity of the decompression buffer BF121 in the compression encoding which is performed by the compression update encoding unit 73 according to the compression update system. As a result, a detection rate of the longest matching string is increased, and a further longest matching string can be detected in the compression encoding. Therefore, the compression rate can be relatively increased compared to the compression encoding of the differential update system.

Figure 12:
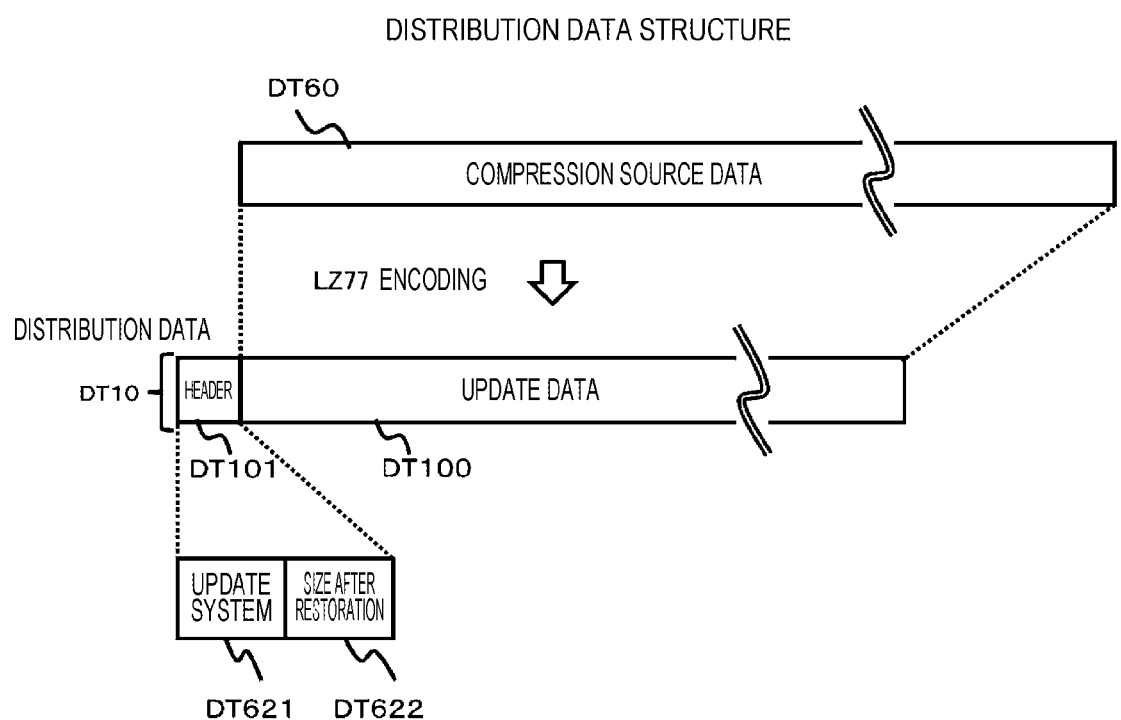
FIG. 12 is a diagram illustrating an exemplary structure of distribution data distributed from the server.

FIG. 12 is a diagram illustrating an exemplary structure of the distribution data DT10 distributed from the server 10 in Step ST22 of FIG. 9.

In FIG. 12, compression source data DT60 represents the original data before of the data compression unit 43 of the server 10 performs the compression encoding process. The content of the compression source data DT60 is different according to the update system. Specifically, in a case where the data compression unit 43 is compressed and encoded according to the differential update system, the differential data DT403 corresponds to the compression source data DT60. On the other hand, in a case where the data compression unit 43 is compressed and encoded according to the compression update system, the new program data DT4021 corresponds to the compression source data DT60.

The update data DT100 is obtained by compressing and encoding the compression source data DT60 according to the compression encoding algorithm such as LZ77. The distribution data DT10 is configured by adding a header DT101 to the update data DT100. The header DT101 includes, for example, the update system DT621 and data such as a restored size DT622. The update system DT621 represents identification information indicating the update system used when generating the update data DT100, which is specifically information for designating any one of the differential update system and the compression update system. Further, the total update system may be designated. The restored size DT622 is information indicating a data size of the new program data DT4021 which is restored from the update data DT100. Further, information other than the update system DT621 and the restored size DT622 may be included in the header DT101.

Figure 13:
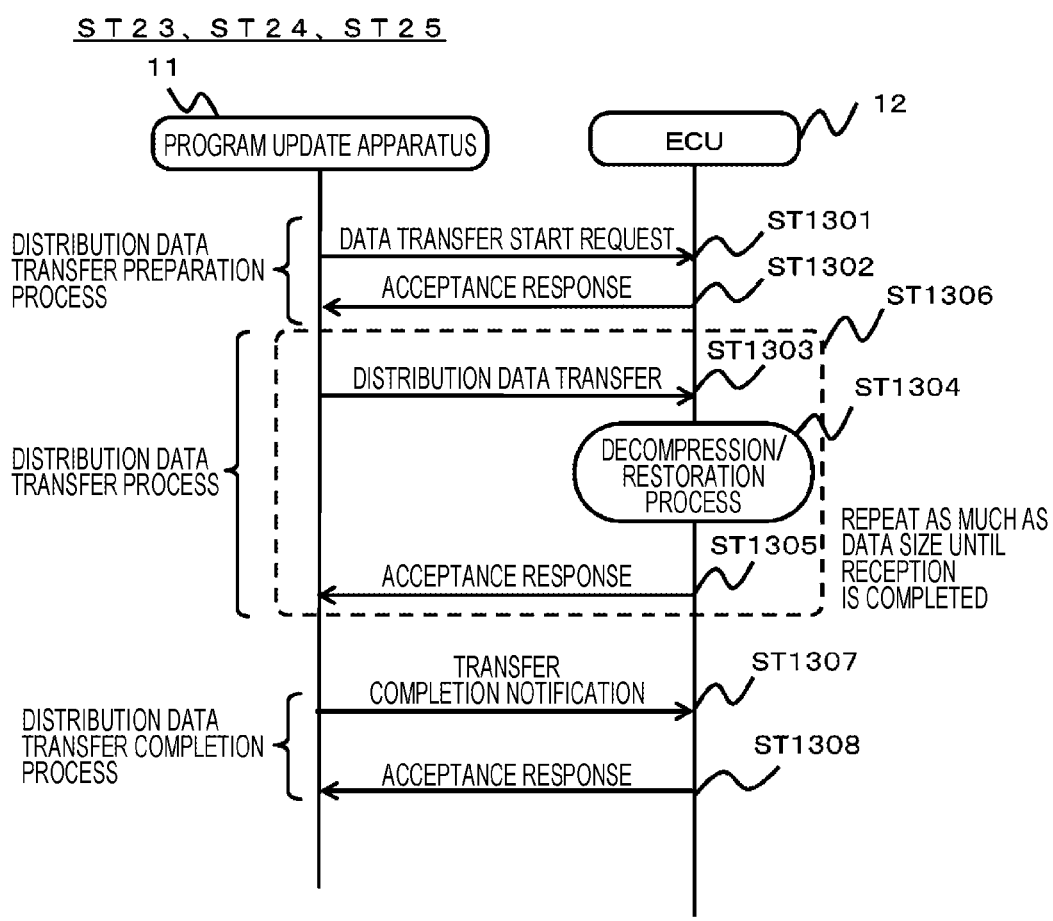
FIG. 13 is a sequence diagram illustrating a flow of a distribution data transfer preparation process, a distribution data transfer process, and a distribution data transfer completion process which are performed by the program update apparatus and the ECU.

Next, the details of the distribution data transfer preparation process, the distribution data transfer process, and the distribution data transfer completion process in Steps ST23 to ST25 of FIG. 9 will be described. FIG. 13 is a sequence diagram illustrating a flow of a distribution data transfer preparation process, a distribution data transfer process, and a distribution data transfer completion process which are performed by the program update apparatus 11 and the ECU 12 in Steps ST23 to ST25.

<ST23: Distribution Data Transfer Preparation Process>

First, the distribution data transfer unit 1004 of the program update apparatus 11 transmits a data transfer start request to the ECU 12 through the intra-vehicle data transfer unit 1005 in Step ST1301. The data transfer start request contains information of a data format, a transmitting data size, and a write destination address indicating a write destination of the transmitting data.

If receiving the data transfer start request from the program update apparatus 11, the data transfer unit 1202 of the ECU 12 notifies the fact to the distribution data reception management unit 1203. If receiving the notification, the distribution data reception management unit 1203 transmits an acceptance response to the program update apparatus 11 through the data transfer unit 1202 in Step ST1302. The acceptance response contains information such as the data size (block size) of the distribution data DT10 which can be transferred at a time by the program update apparatus 11. With this configuration, the distribution data transfer preparation process is completed.

<ST24: Distribution Data Transfer Process>

If receiving the acceptance response from the ECU 12, the distribution data transfer unit 1004 of the program update apparatus 11 divides the distribution data DT10 by a block size designated by the acceptance response. Then, in Step ST1303, the divided distribution data DT10 is transmitted to the ECU 12 through the intra-vehicle data transfer unit 1005.

If receiving the divided distribution data DT10 from the program update apparatus 11, the data transfer unit 1202 of the ECU 12 decompresses the update data DT100 contained in the distribution data DT10 in Step ST1304 to perform a decompression/restoration process to restore the new program data DT4021. Further, the details of the decompression/restoration process performed in Step ST1304 will be described with reference to FIG. 16 below. The new program data DT4021 restored by the decompression/restoration process is stored in the FROM 1112.

If the writing into the FROM 1112 of the new program data DT4021 is completed, the distribution data reception management unit 1203 of the ECU 12 transmits a reception response to the program update apparatus 11 through the data transfer unit 1202 in Step ST1305.

The program update apparatus 11 and the ECU 12 repeatedly perform a series of processes from Step ST1303 to Step ST1305 until all the distribution data DT10 is transferred (Step ST1306). With this configuration, the distribution data transfer process is completed.

<ST25: Distribution Data Transfer Completion Process>

If all the distribution data DT10 is transferred, the distribution data transfer unit 1004 of the program update apparatus 11 transmits a transfer completion notification to the ECU 12 through the intra-vehicle data transfer unit 1005 in Step ST1307.

If receiving the transfer completion notification from the program update apparatus 11, the distribution data reception management unit 1203 of the ECU 12 transmits the acceptance response to the program update apparatus 11 through the data transfer unit 1202 in Step ST1308. With this configuration, the distribution data transfer completion process is completed.

Figure 14:
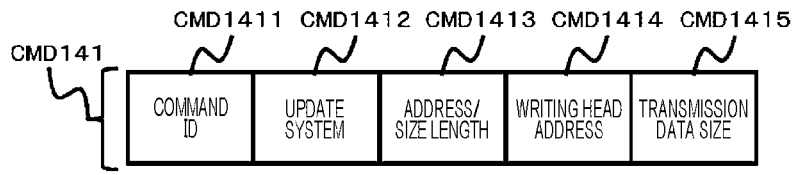
FIG. 14 is a diagram illustrating an exemplary structure of data of a command which is transmitted/received between the program update apparatus and the ECU.
Figure 14:
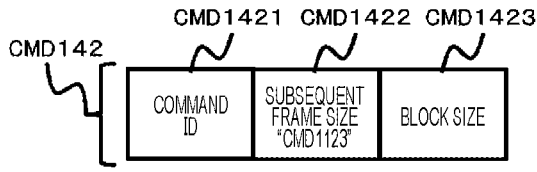
Figure 14:
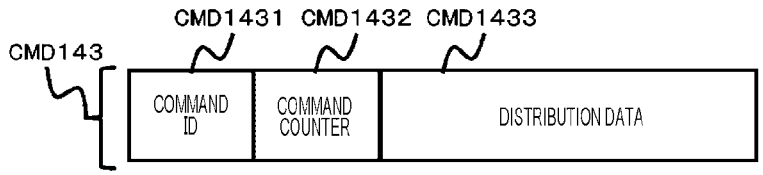
Figure 14:
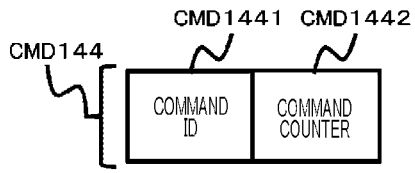
Figure 14:
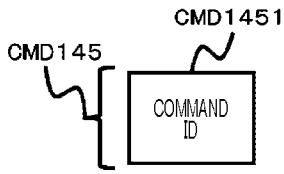

FIG. 14 is a diagram illustrating an exemplary structure of data of a command transferred between the program update apparatus 11 and the ECU 12 in each process described in FIG. 13.

<Command of Distribution Data Transfer Preparation Process>

A command CMD141 is a data transfer start request command which is transferred from the program update apparatus 11 to the ECU 12 in Step ST1301 of FIG. 13. The data transfer start request command CMD141 contains command data CMD1411 to CMD1414. The command data CMD1411 is a command ID to identify the corresponding command, and is set with an identifier indicating the data transfer start request command. The command data CMD1412 is information indicating the update system when the update data DT100 is compressed, and indicates whether the update data DT100 is compressed by the differential update system or by the compression update system. The command data CMD1413 is information indicating the data length of the command data CMD1414 and the command data CMD1415 performed subsequently. The command data CMD1414 is information indicating a head address of an update target block to which the transmitted data is written. The command data CMD1415 is information indicating the size of the distribution data DT10 which is transmitted from the program update apparatus 11 to the ECU 12.

A command CMD142 is an acceptance response command to the data transfer start which is transmitted from the ECU 12 to the program update apparatus 11 in Step ST1302 of FIG. 13. The acceptance response command CMD142 contains command data CMD1421 to CMD1423. The command data CMD1421 is a command ID to identify the corresponding command, and is set with an identifier indicating the acceptance response command to the data transfer start request. The command data CMD1422 is information indicating the data length of the command data CMD1423. The command data CMD1423 is information indicating the data size (block size) which is continually transmitted from the program update apparatus 11 to the ECU 12 at a time.

<Command of Distribution Data Transfer Process>

A command CMD143 is a distribution data transfer command which is transmitted from the program update apparatus 11 to the ECU 12 in Step ST1303 of FIG. 13. The distribution data transfer command CMD143 contains command data CMD1431 to CMD1433. The command data CMD1431 is a command ID to identify the corresponding command, and is set with an identifier indicating the distribution data transfer command. The command data CMD1432 is a command counter indicating the number of times of transmission of the distribution data transfer command CMD143, and is set with a value which is increased at every time when a command is transmitted. The command data CMD1433 is a body portion of the transmitting data, and is set with a value obtained by dividing the distribution data DT10 with the block size designated by the command data CMD1423 of the acceptance response command CMD142 as an upper size.

A command CMD144 is a reception response command which is transmitted from the ECU 12 to the program update apparatus 11 in Step ST1305 of FIG. 13. The reception response command CMD144 contains command data CMD1441 to CMD1442. The command data CMD1441 is a command ID to identify the corresponding command, and is set with an identifier indicating the reception response command to the data transfer. The command data CMD1442 is a command counter indicating the number of times of reception of the distribution data transfer command CMD143, and is set with the same value as the value set in the command data CMD1432 in the received distribution data transfer command CMD143.

Further, as described in FIG. 13, in Step ST1306, the distribution data transfer command CMD143 and the reception response command CMD144 are repeatedly transferred in plural times between the program update apparatus 11 and the ECU 12 until all the divided distribution data DT10 is transferred from the program update apparatus 11 to the ECU 12.

<Command of Distribution Data Transfer Completion Process>

A command CMD145 is a transfer completion notification command which is transferred from the program update apparatus 11 to the ECU 12 in Step ST1307 of FIG. 13. The transfer completion notification command CMD145 contains command data CMD1451. The command data CMD1451 is a command ID to identify the corresponding command, and is set with an identifier indicating the transfer completion notification command.

Further, the acceptance response command transmitted from the ECU 12 to the program update apparatus 11 in Step ST1308 of FIG. 13 has the same command structure as that of the transfer completion notification command CMD145 which is transmitted from the program update apparatus 11 to the ECU 12 in Step ST1307. In this case, the command data CMD1451 is set with an identifier indicating the acceptance response command which is completely transferred.

Figure 15:
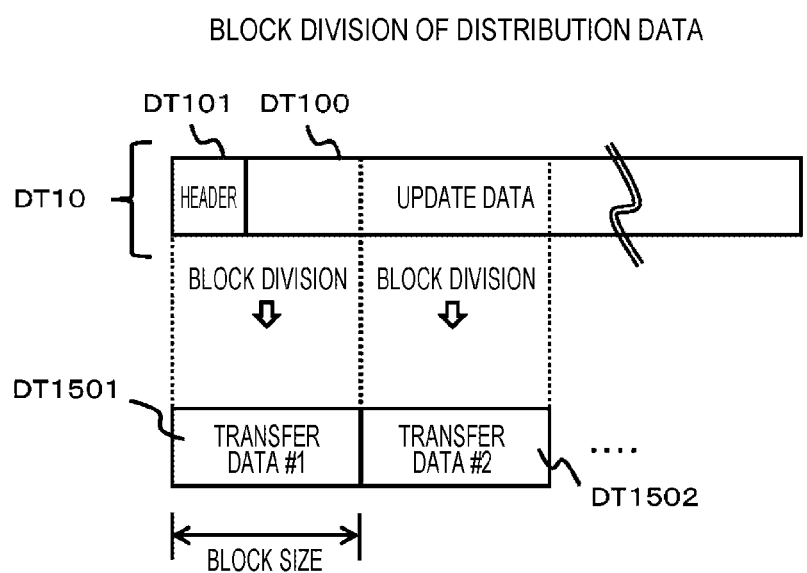
FIG. 15 is a diagram illustrating an exemplary configuration in a case where the distribution data is divided and transmitted.

FIG. 15 is a diagram illustrating an exemplary configuration in a case where the distribution data DT10 is divided and transmitted. The data size of the distribution data DT10 is, for example, 2 MB. As illustrated in FIG. 15, for example, the distribution data is divided by 256 bytes into transfer data DT1501 and transfer data DT1502, and transmitted from the program update apparatus 11 to the ECU 12. In this case, for example, the transfer data D1501 is division data which contains the header DT101 and part of the update data DT100 in the distribution data DT10. Further, in a case where the distribution data DT10 can be transmitted from the program update apparatus 11 to the ECU 12 without division, there is no need to divide the data.

Figure 16:
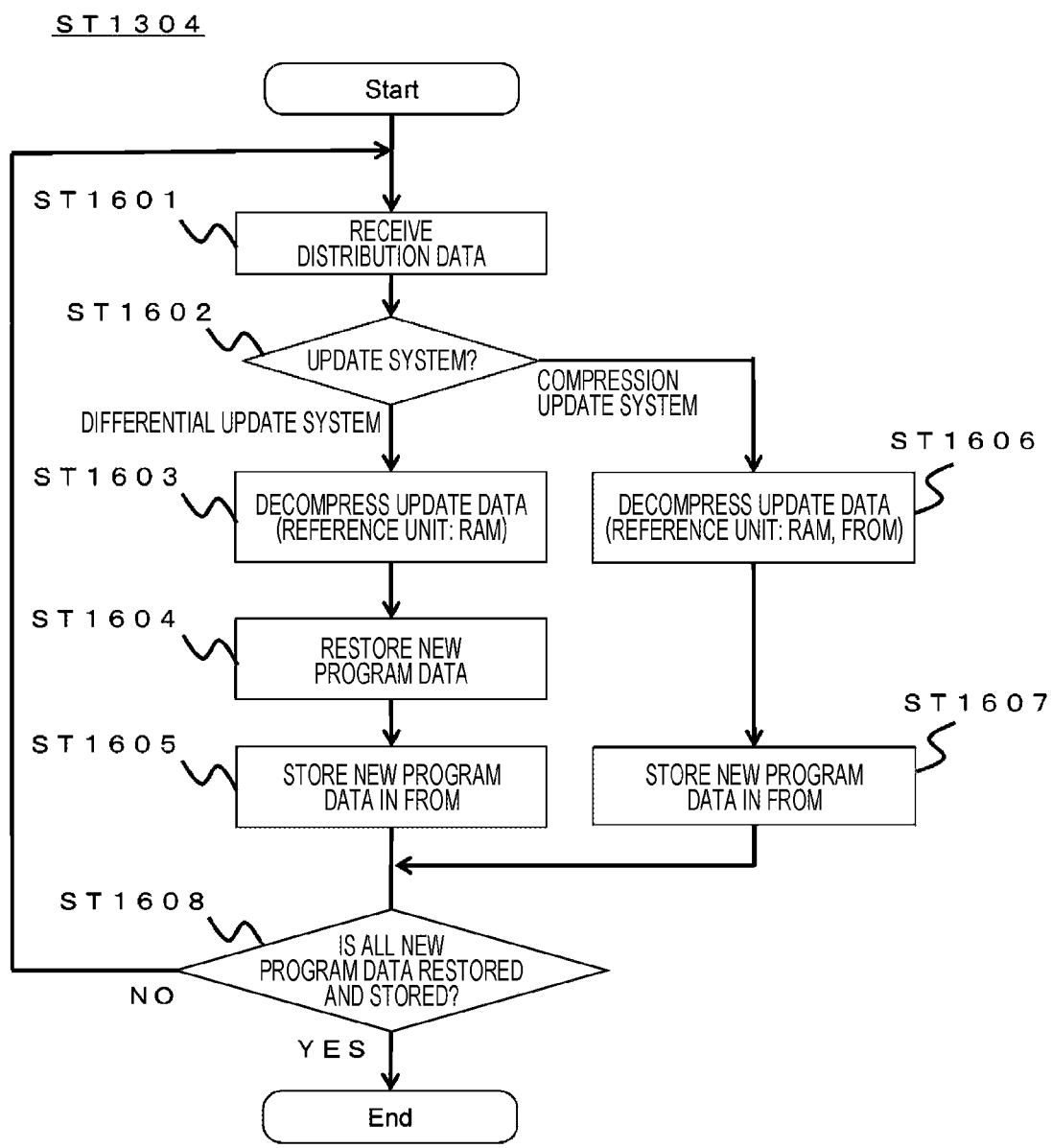
FIG. 16 is a flowchart illustrating a flow of a decompression/restoration process performed by the ECU.

Next, the details of the decompression/restoration process performed Step ST1304 of FIG. 13 will be described. FIG. 16 is a flowchart illustrating a flow of the decompression/restoration process performed by the ECU 12 in Step ST1304.

In Step ST1601, the data transfer unit 1202 receives the distribution data DT10 which is divided into the transfer data D1501 and the transfer data D1502 of FIG. 15 and transmitted from the program update apparatus 11 through the CAN communication device 113. If the data transfer unit 1202 receives the distribution data DT10, the distribution data reception management unit 1203 stores the distribution data DT10 in the reception buffer BF120, and notifies the reception of the distribution data DT10 to the restoration control unit 1201. If the notification is received, the restoration control unit 1201 instructs the update data decompression unit 1204 to decompress the update data DT100.

If the decompression instruction of the update data DT100 is received from the restoration control unit 1201, the update data decompression unit 1204 reads the distribution data DT10 stored in the reception buffer BF120 in Step ST1602, and checks whether the update system designated in the header DT101 is the differential update system or the compression update system. As a result, in a case where the update system is the differential update system, the process proceeds to Step ST1603. In the case of the compression update system, the process proceeds to Step ST1606.

In Step ST1603, the update data decompression unit 1204 sets the decompression buffer BF121 on the SRAM 1111, and stores the update data DT100 in the decompression buffer BF121. Further, the capacity of the decompression buffer BF121 set in the SRAM 1111 is equal to or more than the size of the sliding window WD10 which is set by the differential update encoding unit 72 of the server 10 when the differential data DT403 is compressed and encoded in Step ST504 of FIG. 10. Then, the reference portion to be used for the decompression is set in the update data DT100 stored in the decompression buffer BF121, and the update data DT100 is decompressed on the basis of the data string of the reference portion. If the decompression of the update data DT100 ends, the restoration control unit 1201 instructs the new program restoration unit 1205 to restore the new program data DT123 using the decompressed update data DT100 (that is, the differential data DT403).

If the restoration instruction of the new program data DT123 is received from the restoration control unit 1201, the new program restoration unit 1205 performs the restoration process of the new program data DT123 according to the differential update system in Step ST1604. Specifically, the new program restoration unit 1205 reads the old program data DT122 from the FROM 1112, and applies the differential data DT403 thereto, so that the old program data DT122 is converted into the new program data DT123, and the new program data DT123 is restored. Subsequently, in Step ST1605, the new program restoration unit 1205 stores the new program data DT123 restored in Step ST1604 in the FROM 1112.

In Step ST1606, similarly to Step ST1603, the update data decompression unit 1204 sets the decompression buffer BF121 on the SRAM 1111, and stores the update data DT100 in the decompression buffer BF121. Then, the reference portion to be used for decompression is set in each of the update data DT100 stored in the decompression buffer BF121 and the new program data DT123 which is already restored and stored in the FROM 1112, and the update data DT100 is decompressed on the basis of the data string of each reference portion. If the decompression of the update data DT100 ends, the new program restoration unit 1205 stores the decompressed update data DT100 (that is, the new program data DT4021) in the FROM 1112 as the restored new program data DT123.

If the new program data DT123 is stored in the FROM 1112 in Step ST1605 or ST1607, the restoration control unit 1201 checks whether all the new program data DT123 is completely restored in Step ST1608. As a result, in a case where there is new program data DT123 which is not restored, the process returns to Step ST1601 to receive the next distribution data DT10, and repeatedly performs the decompression process of the update data DT100 and the restoration process of the new program data DT123. On the other hand, in a case where all the new program data DT123 is completely restored, the decompression/restoration process of FIG. 16 ends.

Figure 17:
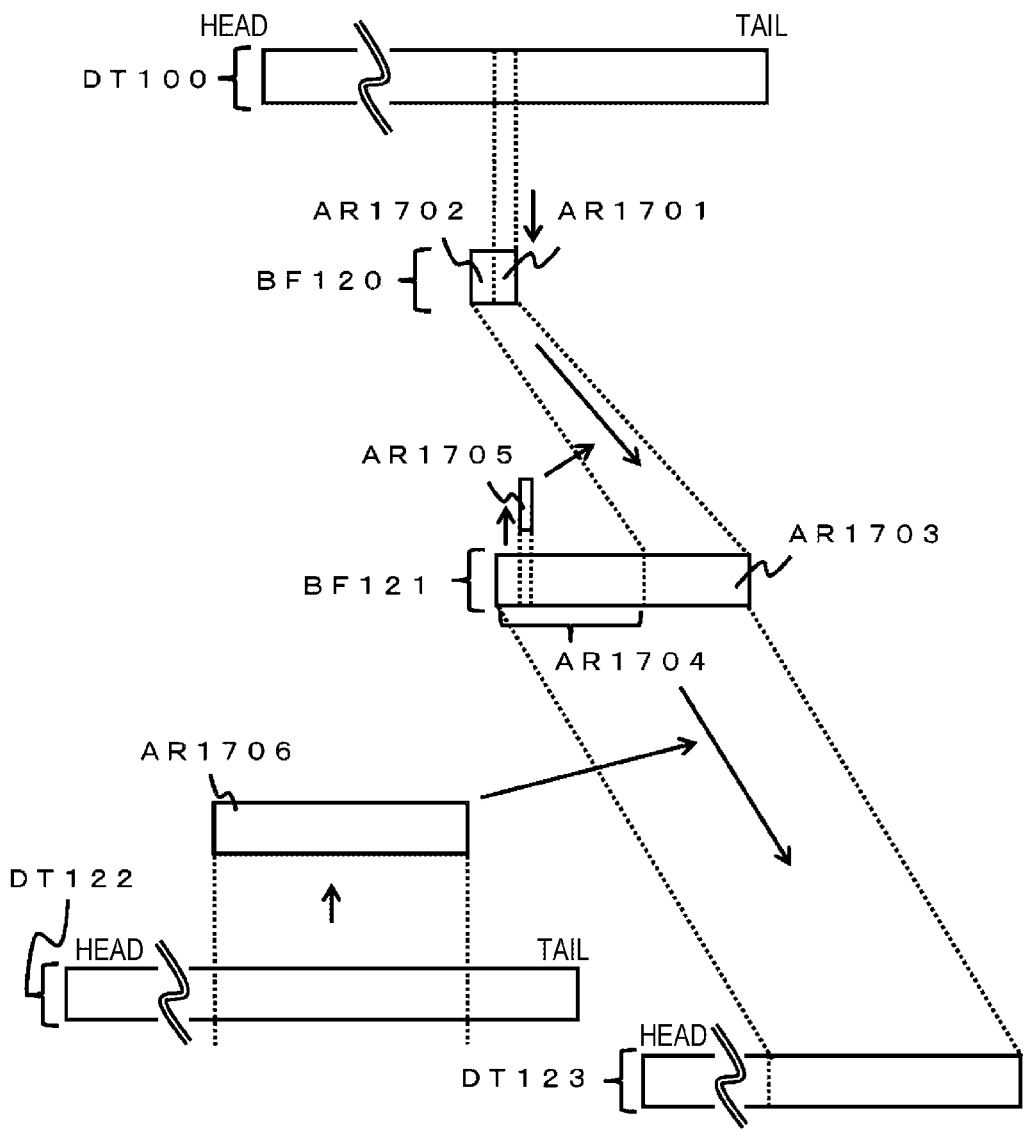
FIG. 17 is a diagram for describing the decompression/restoration process of a differential update system.

FIG. 17 is a diagram for describing the decompression/restoration process of a differential update system which is performed in Steps ST1603 and ST1604 of FIG. 16. At this time, in the ECU 12, part of the update data DT100 stored in the program update apparatus 11 is received as the transfer data AR1701, and stored in the reception buffer BF120. Further, the transfer data AR1702 received before the transfer data AR1701 is already stored in the reception buffer BF120.

In the decompression/restoration process of the differential update system, the update data decompression unit 1204 decodes the transfer data AR1701 and the transfer data AR1702 stored in the reception buffer BF120 to generate differential data AR1703, and stores the data in the decompression buffer BF121 which is set on the SRAM 1111. At this time, the update data decompression unit 1204 sets differential data AR1704 stored in the decompression buffer BF121 to the reference portion. Then, the corresponding data string (the longest matching string AR1705) is copied in the differential data AR1704 from the position information and the information of length of the data string included in the pointers of the transfer data AR1701 and the transfer data AR1702, and replaced with the pointer so as to be decoded. Further, the differential data AR1704 generated before the differential data AR1703 is already stored in the decompression buffer BF121.

In a case where the decompression/restoration process of the differential update system is performed, the update data decompression unit 1204 sets the differential data AR1704 stored in the decompression buffer BF121 on the SRAM 1111 to the reference portion as described above, and decompresses the transfer data AR1701 and the transfer data AR1702. With this configuration, the update data DT100 can be decompressed using the SRAM 1111 without using the FROM 1112.

If the differential data AR1703 is generated by the update data decompression unit 1204, the new program restoration unit 1205 restores the new program data DT123 using the differential data AR1703 and the differential data AR1704 stored in the decompression buffer BF121, and the old program data DT122 stored in the FROM 1112. At this time, the new program restoration unit 1205 reads the data string corresponding to the range of the differential data AR1703 and the differential data AR1704 from the old program data DT122, and combines the data string to the differential data so as to restore the new program data DT123. If the restoration of the new program data DT123 is completed, the data is stored in the FROM 1112.

Figure 18:
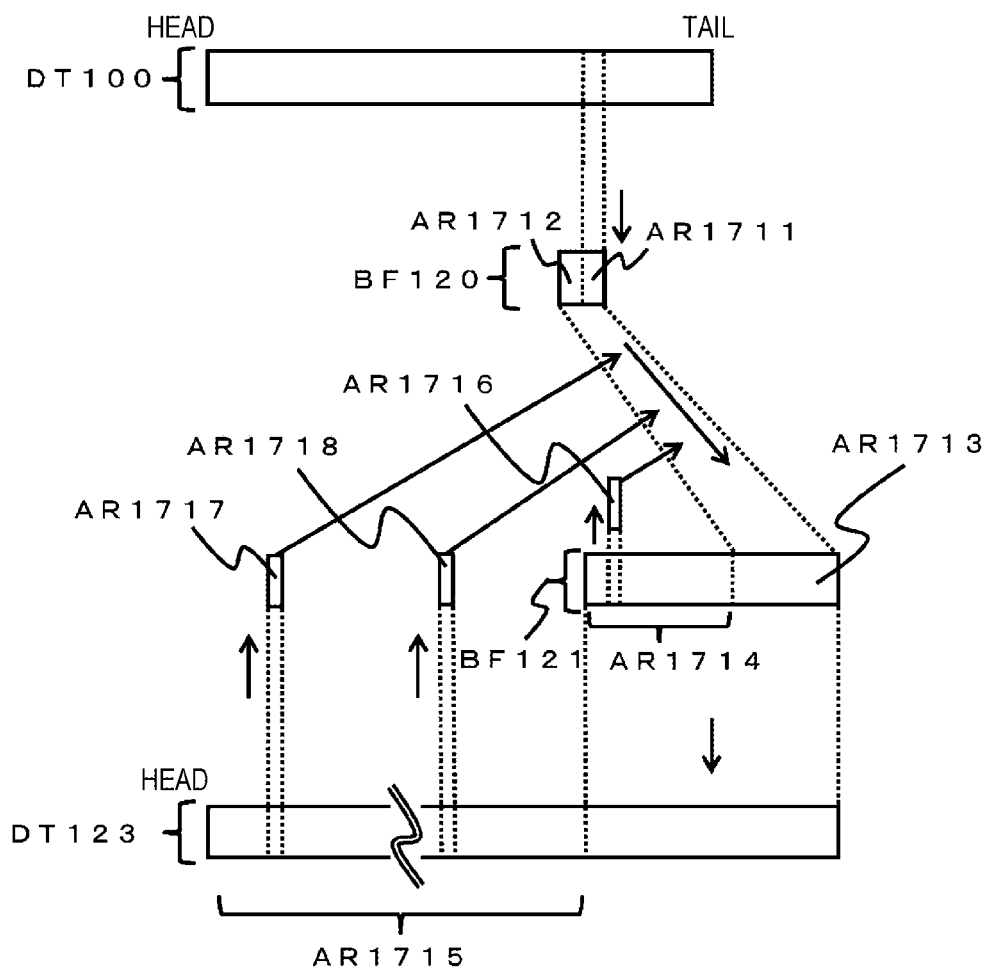
FIG. 18 is a diagram for describing the decompression/restoration process according to a compression update system.

FIG. 18 is a diagram for describing the decompression/restoration process of the compression update system which is performed in Step ST1606 of FIG. 16. At this time, in the ECU 12, part of the update data DT100 stored in the program update apparatus 11 is received as the transfer data AR1711, and stored in the reception buffer BF120. Further, the transfer data AR1712 received before the transfer data AR1711 is already stored in the reception buffer BF120.

In the decompression/restoration process of the compression update system, the update data decompression unit 1204 decodes the transfer data AR1711 and the transfer data AR1712 stored in the reception buffer BF120 to generate decoded data AR1713 which is part of the new program data DT123, and stores the data in the decompression buffer BF121 which is set on the SRAM 1111. At this time, the update data decompression unit 1204 sets decoded data AR1714 stored in the decompression buffer BF121 and decoded data AR1715 stored in the FROM 1112 to the reference portion. Further, the decoded data AR1714 and the decoded data AR1715 are also part of the new program data DT123 similarly to the decoded data AR1713. Then, the data strings (the longest matching string AR1716 on the decompression buffer BF121 indicated by a first pointer, the longest matching string AR1717 on the FROM 1112 indicated by a second pointer, and AR1718 on the FROM 1112 indicated by a third pointer) corresponding in the decoded data AR1714 and the decoded data AR1715 are copied from the position information and the information of length of the data string contained in the pointers of the transfer data AR1711 and the transfer data AR1712, and replaced with the pointers so as to be decoded. Further, the decoded data AR1714 generated before the decoded data AR1713 is already stored in the decompression buffer BF121.

In a case where the decompression/restoration process of the compression update system is performed, the update data decompression unit 1204 sets the decoded data AR1714 stored in the decompression buffer BF121 on the SRAM 1111, and the decoded data AR1715 stored in the FROM 1112 to the reference portion as described above, and decompresses the transfer data AR1711 and the transfer data AR1712. With this configuration, the update data DT100 can be decompressed using the SRAM 1111 and the FROM 1112. In other words, the data of the FROM 1112 which is already restored and stored is also set to the reference portion at the time of decompression, so that the update data DT100 compressed and encoded at a high compression rate compared to the decompression/restoration process of the differential update system can be decompressed without increase the size of the decompression buffer BF121.

If the decoded data AR1713 is generated by the update data decompression unit 1204, the new program restoration unit 1205 stores the decoded data AR1713 and the decoded data AR1714 stored in the decompression buffer BF121 in the FROM 1112 as part of the new program data DT123.

The update data decompression unit 1204 and the new program restoration unit 1205 repeatedly performs the decompression of the update data DT100 and the restoration of the new program data DT123 as described in FIGS. 17 and 18. With this configuration, all the new program data DT123 can be restored in each of the decompression/restoration process of the differential update system and the decompression/restoration process of the compression update system.

According to the first embodiment of the invention described above, the following operational advantages are achieved.

(1) The program update system of this embodiment includes the server 10 and the ECU 12 which are connected to each other through the extra-vehicle network 20 and the intra-vehicle network 21. The server 10 includes the data compression unit 43 which generates the update data DT100 compressed according to any one of a plurality of update systems, and the data transfer unit 45 which transmits the distribution data DT10 to the ECU 12 through the distribution network. The distribution data DT10 contains the header DT101 which contains information to designate the update system to be used for generating the update data DT100, and the update data DT100. The ECU 12 includes the data transfer unit 1202 which receives the distribution data DT10, the update data decompression unit 1204 which decompresses the update data DT100 from the distribution data DT10 received from the data transfer unit 1202, and the new program restoration unit 1205 which restores the new program data DT123 after updating according to the update system designated in the header DT101 using the update data DT100 decompressed by the update data decompression unit 1204. In the program update system, the update data decompression unit 1204 of the ECU 12 switches the decompression method to decompress the update data DT100 on the basis of the update system designated in the header DT101. With such a configuration, it is possible to reduce the data amount of the update data DT100 transmitted from the server 10 to the ECU 12 by increasing the compression rate of the update data DT100 when the program of the ECU 12 corresponding to the plurality of update systems is updated even though the capacity of the decompression buffer BF121 used in the decompression process in the SRAM 1111 (volatile memory). As a result, the program can be updated at a high speed even if the ECU 12 has a small capacity of the volatile memory.

(2) The update system to be used for generating the update data DT100 in the server 10 includes the differential update system in which the differential data DT403 is compressed to generate the update data DT100, and the compression update system in which the new program data DT4021 is compressed to generate the update data DT100 on the basis of the old program data DT4022 before updating and the new program data DT4021. In a case where the update system designated in the header DT101 is the differential update system, the update data decompression unit 1204 of the ECU 12 decompresses the update data DT100 using a first decompression method (Steps ST1602 and ST1603 of FIG. 16). On the other hand, in a case where the update system designated in the header DT101 is the compression update system, the update data DT100 is decompressed using a second decompression method different from the first decompression method (Steps ST1602 and ST1606 of FIG. 16). With such a configuration, the update data DT100 can be decompressed using an appropriate decompression method with respect to each of the differential update system and the compression update system.

(3) The ECU 12 includes the SRAM 1111 (volatile memory) and the FROM 1112 (non-volatile memory). In the first decompression method, as described in FIG. 17, the update data DT100 is decompressed using the SRAM 1111 without using the FROM 1112. On the other hand, in the second decompression method, the update data DT100 is decompressed using the SRAM 1111 and the FROM 1112 as described in FIG. 18. On the other hand, as described in FIG. 11, in a case where the update data DT100 is generated according to the compression update system, the data compression unit 43 of the server 10 expands the range of the dictionary data used in compression compared to a case where the update data DT100 is generated according to the differential update system. With such a configuration, even if the capacity to be used in the decompression process in the SRAM 1111 is small, the update data DT100 compressed at a compression rate higher than that of the compression update system can be decompressed in the ECU 12.

(4) The distribution network transmitting the distribution data DT10 includes the intra-vehicle network 21 which is provided in the vehicle 1, and the extra-vehicle network 20 which is provided in the outside of the vehicle 1. The ECU 12 is mounted in the vehicle 1 and connected to the intra-vehicle network 21. The server 10 is able to communicate with the intra-vehicle network 21 through the extra-vehicle network 20. The data transfer unit 45 of the server 10 transmits the distribution data DT10 to the ECU 12 through the extra-vehicle network 20 and through the intra-vehicle network 21. The ECU 12 receives the distribution data DT10 through the intra-vehicle network 21. With such a configuration, the distribution data DT10 can be easily transmitted to the ECU 12 mounted in the vehicle 1 at any timing.

Second Embodiment

A second embodiment will be described about a program update method of the in-vehicle ECU in the invention. Further, in this embodiment, the description of the portions common to the first embodiment will be omitted unless the description is particularly necessary.

Figure 19:
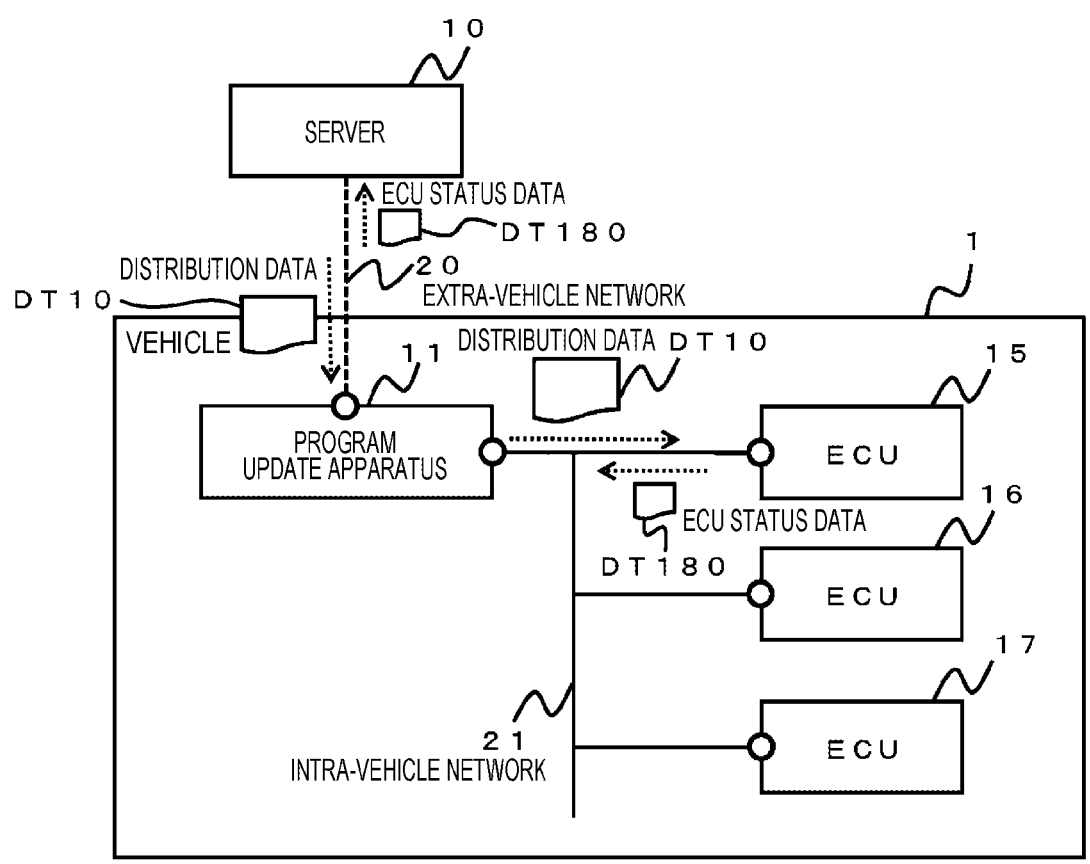
FIG. 19 is a block diagram illustrating an exemplary configuration of a program update system according to a second embodiment of the invention.

FIG. 19 is a block diagram illustrating an exemplary configuration of the program update system according to the second embodiment of the invention. The program update system of this embodiment includes ECUs 15, 16, and 17 instead of the ECUs 12, 13, and 14 described in the first embodiment. These ECUs further perform a process of uploading ECU status data DT180 indicating the state of each ECU to the server 10 through the program update apparatus 11 before the distribution data DT10 is transferred compared to the ECUs 12, 13, and 14 in the first embodiment.

The ECU status data DT180 is data which contains the state of the SRAM 1111 in each ECU as the state of each ECU (for example, information such as an available capacity as the decompression buffer BF121 at the time of updating a program in the SRAM 1111). In the first embodiment, the available capacity of the SRAM 1111 as the decompression buffer BF121 when each ECU performs the program update process is set in advance to a fixed value. The size of the sliding window WD10 to be used for compression encoding of the differential update system is determined in accordance with the capacity of the decompression buffer BF121. However, if the capacity of the SRAM 1111 of each ECU is different in this embodiment, the available capacity of the SRAM 1111 of each ECU is included in the ECU status data DT180 and notified to the server 10 before the distribution data DT10 is transferred on the basis of the difference in the available capacity of the SRAM 1111 according to the status of the ECU. The server 10 determines the size of the sliding window WD10 according to the available capacity of SRAM 1111 notified by the ECU status data DT180 from each ECU, and sets the size of the compression input buffer BF101 according to the determined size.

Each of the ECUs 15, 16, and 17 is configured similarly to the ECU 12 illustrated in FIG. 7 in the first embodiment. The microcomputer 111 performs software different from the program restoration software 1200 described in the first embodiment. In the following, the software performed by the microcomputer 111 in this embodiment will be described as a program restoration software 2000.

Figure 20:
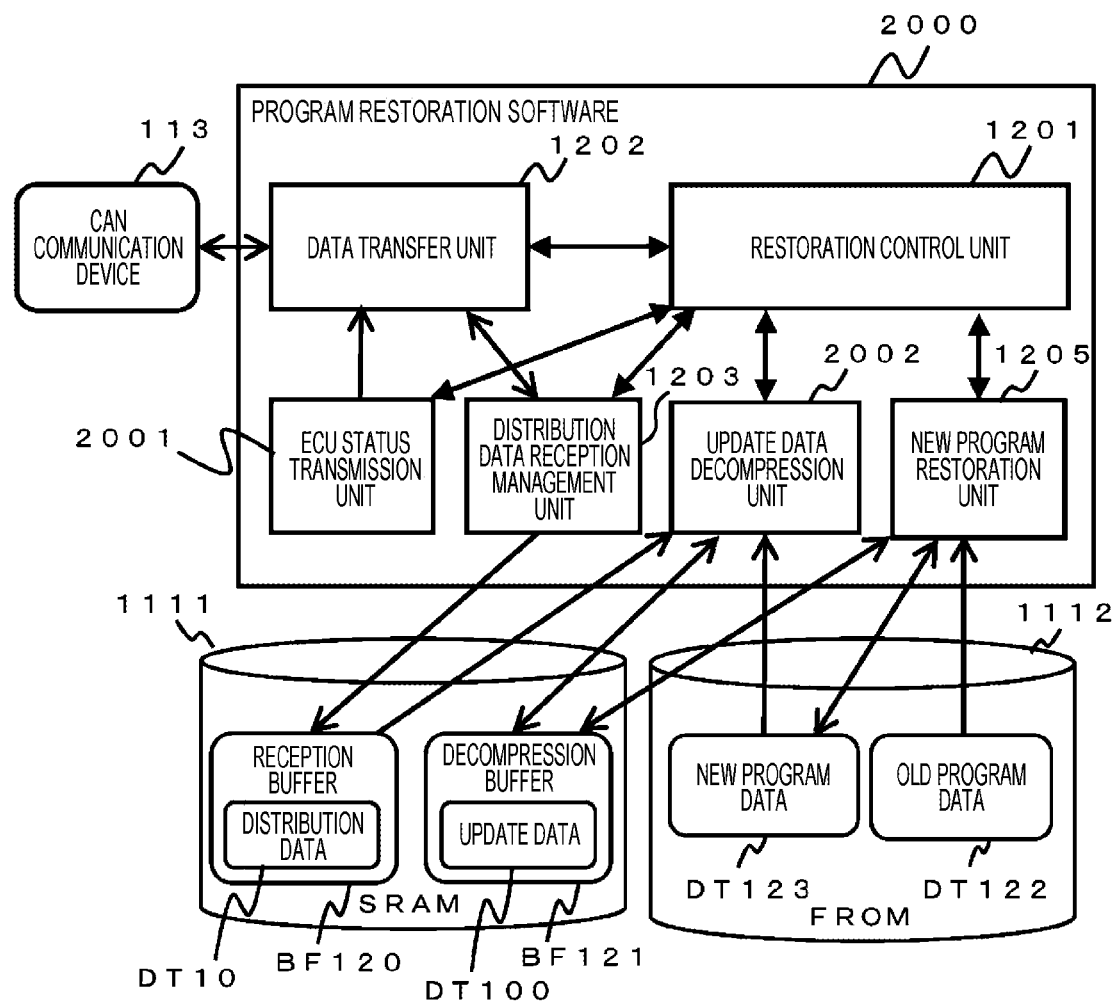
FIG. 20 is a block diagram illustrating an exemplary configuration of a function of a program restoration software according to the second embodiment of the invention.

FIG. 20 is a block diagram illustrating an exemplary configuration of a function of the program restoration software 1200 according to the second embodiment of the invention. The program restoration software 2000 further includes an ECU status transmission unit 2001 compared to the program restoration software 1200 of the first embodiment described in FIG. 8. In addition, an update data decompression unit 2002 is included instead of the update data decompression unit 1204. The other configurations are the same as those of the program restoration software 1200 described in the first embodiment.

The ECU status transmission unit 2001 operates the CAN communication device 113 according to an instruction from the restoration control unit 1201, and transmits the ECU status data DT180 to the program update apparatus 11. Further, the ECU status data DT180 transmitted to the program update apparatus 11 is transferred to the server 10 by the program update apparatus 11.

The update data decompression unit 2002 decompresses the update data DT100 from the distribution data DT10 which is stored in the reception buffer BF120, and stores the update data to a decompression buffer BF121 which is provided on the SRAM 1111 similarly to the update data decompression unit 1204 described in the first embodiment. At this time, the decompression method is switched on the basis of the update system designated by the header DT101 of the distribution data DT10. Further, the update data decompression unit 2002 has a function of setting an algorithm and a parameter to be used in the decompression process according to the algorithm and the parameter used when the server 10 compresses and encodes the update data DT100. Further, the notification of the algorithm and the parameter of the compression encoding may be performed from the server 10 to each ECU by combining these pieces of information with the header DT101.

Figure 21:
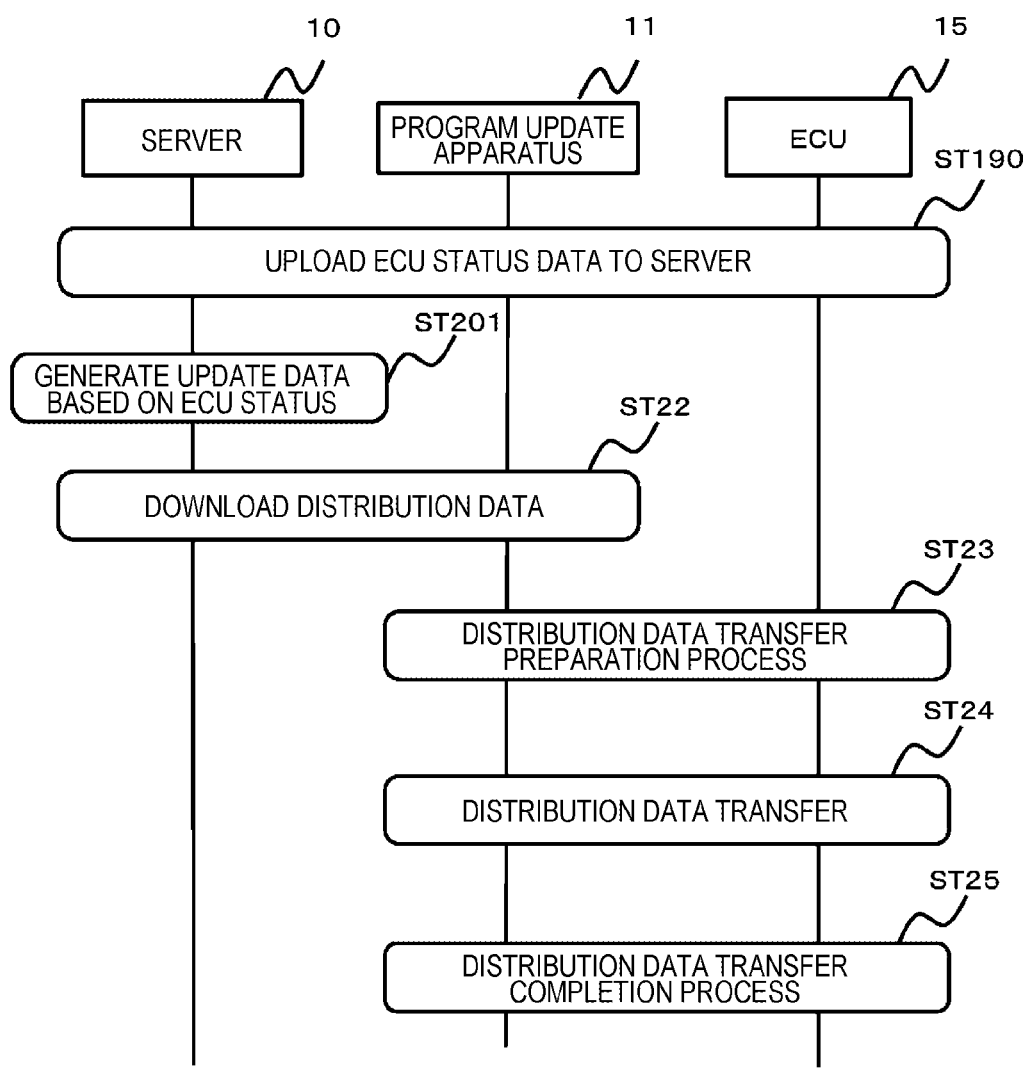
FIG. 21 is a sequence diagram illustrating the entire flow of a program update process in the program update system according to the second embodiment of the invention.

FIG. 21 is a sequence diagram illustrating the entire flow of the program update process in the program update system according to the second embodiment of the invention. Further, the description below will be given about a case the program of the ECU 15 is updated as a representative example, but may be similarly applied even to a case where the programs of the other ECUs 16 and 17 are updated.

First, the ECU 15 uploads the ECU status data DT180 to the server 10 in Step ST190. The ECU status data DT180 uploaded from the ECU 15 is stored in the memory unit 32 in the server 10.

Next, the server 10 performs the update data generation process in Step ST201 to generate the update data DT100 which is based on the distribution data DT10 distributed to the ECU 15 on the basis of the ECU status data DT180 stored in the memory unit 32. In the update data generation process, the distribution control unit 41 of the server 10 reads the ECU status data DT180 to check the available capacity of the SRAM 1111 in the ECU 15, and sets the size of the compression input buffer BF101 in the compression encoding. In accordance with the size of the compression input buffer BF101 set in this way, the data compression unit 43 sets the size of the sliding window WD10, and compresses and encodes the differential data DT403 as the compression source data, so that the data compression of the differential update system is performed to generate the update data DT100. At this time, another encoding algorithm such as LZ78 having a higher compression rate may be used in addition to the encoding algorithm such as LZ77 described in the first embodiment. Further, in the case of the data compression of the compression update system, the update data DT100 may be generated in a method similar to that described in the first embodiment.

If the update data DT100 is generated in Step ST201, the distribution data DT10 is downloaded from the server 10 to the program update apparatus 11 on the basis of the update data DT100 similarly to the first embodiment. At this time, in the header DT101 of the distribution data DT10, information such as the algorithm and the parameter of the compression encoding used for generating the update data DT100 in the server 10 is stored as the update system DT621. With this configuration, the ECU 15 can decompress the update data DT100 from the distribution data DT10.

After Step ST23, the program update apparatus 11 and the ECU 15 perform the processes similar to those described in the first embodiment. With this configuration, the program of the ECU 15 can be updated using the distribution data DT10.

According to the second embodiment of the invention, the ECU 15 further includes the ECU status transmission unit 2001 which transmits the ECU status data DT180 to the server 10 (the transmission source of the distribution data DT10) to notify the state of the SRAM 1111 (volatile memory). The data compression unit 43 of the server 10 sets the range of the sliding window WD10 as the dictionary data at the time of compression encoding on the basis of the state of the SRAM 1111 which is notified from the ECU status transmission unit 2001. With such a configuration, the compression rate of the update data 100 can also be flexibly changed according to an operating situation of the SRAM 1111 in the ECU 15 in addition to the operational effects similar to those described in the first embodiment.

Further, in the embodiments, the distribution data DT10 may be directly transmitted from the server 10 to each ECU without installing the program update apparatus 11. Even with such a configuration, the operational effects similar to those described in the embodiments can be achieved.

In addition, the embodiments have been described about the examples of the program update system which updates the program of the ECU mounted in a vehicle, but the invention is not limited thereto. The invention is applicable to updating the program of various control apparatuses connected to a network.

The technical scope of the invention is not limited to the above embodiments, but various modifications can be made of course within a scope of the technical ideas of the invention.

The disclosure of the following basic priority applications is incorporated herein by reference.

Japanese Patent Application No. 2017-079821, filed on Apr. 13, 2017

REFERENCE SIGNS LIST

1 vehicle
10 server
11 program update apparatus
12, 13, 14, 15, 16, 17 ECU
20 extra-vehicle network
21 intra-vehicle network
31 CPU
32 memory unit
33 display unit
34 operation input unit
35 WAN communication device
40 program distribution software
41 distribution control unit
42 differential data generation unit
43 data compression unit
44 data distribution unit
45 data transfer unit
91 microcomputer
9101 SRAM
9102 FROM
92 extra-vehicle communication device
93 intra-vehicle communication device
1000 program update management software
1001 update control unit
1002 extra-vehicle data transfer unit
1003 distribution data reception management unit
1004 distribution data transfer unit
1005 intra-vehicle data transfer unit
111 microcomputer
1111 SRAM
1112 FROM
112 dedicated IC
113 CAN communication device
114 sensor
115 actuator
1200 program restoration software
1201 restoration control unit
1202 data transfer unit
1203 distribution data reception management unit
1204, 2002 update data decompression unit
1205 new program restoration unit
2001 ECU status transmission unit

The invention claimed is:

1. A control apparatus, comprising:
a reception unit which receives distribution data, the distribution data containing compressed update data and a header which includes information to designate any one of a plurality of update compression systems;
a decompression unit which decompresses the update data from the distribution data received by the reception unit using a decompression method corresponding to the designated update compression system; and
a restoration unit which restores a new program after updating according to an update compression system designated in the header using the update data decompressed by the decompression unit, wherein the decompression unit switches a decompression method when decompressing the update data on the basis of the update compression system designated in the header.

2. The control apparatus according to claim 1, wherein:
the plurality of update compression systems includes a differential update compression system in which a differential between an old program before updating and the new program is compressed to generate the update data, and a compression update compression system in which the new program is compressed to generate the update data, and
the decompression unit is configured to: decompress the update data using a first decompression method in a case where the update compression system designated in the header is the differential update compression system, and decompress the update data using a second decompression method different from the first decompression method in a case where the update compression system designated in the header is the compression update compression system.

3. The control apparatus according to claim 2, wherein:
the control apparatus includes a volatile memory and a non-volatile memory,
the first decompression method is a method for decompressing the update data using the volatile memory without using the non-volatile memory, and
the second decompression method is a method for decompressing the update data using the volatile memory and the non-volatile memory.

4. The control apparatus according to claim 3, further comprising: a notification unit which notifies a state of the volatile memory to a transmission source of the distribution data.

5. The control apparatus according to claim 1, wherein the control apparatus is connected to an intra-vehicle network which is mounted in a vehicle and installed in the vehicle, and the reception unit receives the distribution data through the intra-vehicle network.

6. A program update system, comprising:
a server and a control apparatus which are connected to each other through a network,
wherein the server includes:
a data compression unit which generates compressed update data according to any one of a plurality of update compression systems, and
a transmission unit which transmits distribution data to the control apparatus through the network, the distribution data containing the update data and a header which includes information to designate the update compression system to be used for generating the update data,
the control apparatus includes:
a reception unit which receives the distribution data,
a decompression unit which decompresses the update data from the distribution data-received by the reception unit, and
a restoration unit which restores a new program after updating according to the update compression system designated in the header using the update data decompressed by the decompression unit, and
the decompression unit switches a decompression method when decompressing the update data on the basis of the update compression system designated in the header.

7. The program update system according to claim 6,
wherein the update compression system comprises: a differential update compression system in which a differential between an old program before updating and the new program is compressed to generate the update data, and a compression update compression system in which the new program is compressed to generate the update data, and the decompression unit is configured to:
decompress the update data using a first decompression method in a case where the update compression system designated in the header is the differential update compression system, and
decompress the update data using a second decompression method different from the first decompression method in a case where the update compression system designated in the header is the compression update compression system.

8. The program update system according to claim 7, wherein:
the control apparatus includes a volatile memory and a non-volatile memory,
the first decompression method is a method for decompressing the update data using the volatile memory without using the non-volatile memory,
the second decompression method is a method for decompressing the update data using the volatile memory and the non-volatile memory, and
the data compression unit expands a range of dictionary data to be used in the compression in a case where the update data is generated according to the compression update compression system compared to a case where the update data is generated according to the differential update compression system.

9. The program update system according to claim 8, wherein
the control apparatus further includes a notification unit which notifies a state of the volatile memory to the server, and
the data compression unit sets the range of the dictionary data on the basis of the state of the volatile memory notified by the notification unit.

10. The program update system according to claim 6, wherein:
the network includes an intra-vehicle network which is installed in a vehicle, and an extra-vehicle network which is installed outside the vehicle,
the control apparatus is mounted in the vehicle to be connected to the intra-vehicle network,
the server is able to communicate with the intra-vehicle network through the extra-vehicle network, and
the transmission unit transmits the distribution data to the control apparatus through the extra-vehicle network and the intra-vehicle network.

11. A program update method which updates a program of a control apparatus, comprising:
receiving distribution data by the control apparatus, the distribution data containing compressed update data and a header which includes information to designate any one of a plurality of update compression systems;
switching a decompression method by the control apparatus on the basis of the update compression system designated in the header to decompress the update data from the received distribution data; and restoring a new program after updating according to the update compression system designated in the header by the control apparatus using the decompressed update data.

12. The program update method according to claim 11, wherein:

the update compression system comprises a differential update compression system in which a differential between an old program before updating and the new program is compressed to generate the update data, and a compression update compression system in which the new program is compressed to generate the update data, the update data is decompressed by the control apparatus using a first decompression method in a case where the update compression system designated in the header is the differential update compression system, and the update data is decompressed by the control apparatus using a second decompression method different from the first decompression method in a case where the update compression system designated in the header is the compression update compression system.

13. The program update method according to claim 12, the control apparatus includes a volatile memory and a non-volatile memory, the first decompression method is a method for decompressing the update data using the volatile memory without using the non-volatile memory, and the second decompression method is a method for decompressing the update data using the volatile memory and the non-volatile memory.

14. The program update method according to claim 13, wherein the control apparatus notifies a state of the volatile memory to a transmission source of the distribution data before receiving the distribution data.

* * * * *